(12) United States Patent  (10) Patent No.: US 9,274,183 B2
Ausserlechner  (45) Date of Patent: Mar. 1, 2016

(54) VERTICAL HALL DEVICE COMPRISING FIRST AND SECOND CONTACT INTERCONNECTIONS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 451 days.

(21) Appl. No.: 13/530,296

(22) Filed: Jun. 22, 2012

(65) Prior Publication Data

US 2013/0342195 A1    Dec. 26, 2013

(51) Int. Cl.
*G01R 33/07*    (2006.01)
*H01L 43/06*    (2006.01)

(52) U.S. Cl.
CPC .............. *G01R 33/07* (2013.01); *H01L 43/065* (2013.01)

(58) Field of Classification Search
CPC ..... H01L 43/065; G01R 33/07; G01R 33/075
USPC ......... 324/96, 117 R, 117 H, 207.2, 246, 251, 324/252, 260; 357/427, E43.003; 257/427, 257/E43.003
See application file for complete search history.

(56) References Cited

U.S. PATENT DOCUMENTS

| | | | |
|---|---|---|---|
| 4,929,993 A | 5/1990 | Popovic | |
| 5,253,532 A | 10/1993 | Kamens | |
| 5,679,973 A | 10/1997 | Mochizuki et al. | |
| 6,441,460 B1 | 8/2002 | Vieback | |
| 6,903,429 B2 | 6/2005 | Berndt et al. | |
| 7,474,093 B2 | 1/2009 | Ausserlechner | |
| 7,782,050 B2 | 8/2010 | Ausserlechner et al. | |
| 7,872,322 B2 | 1/2011 | Schott et al. | |
| 7,980,138 B2 | 7/2011 | Ausserlechner | |
| 8,164,149 B2 | 4/2012 | Schott | |
| 9,103,868 B2 | 8/2015 | Ausserlechner | |
| 2005/0230770 A1 | 10/2005 | Oohira | |
| 2006/0011999 A1 | 1/2006 | Schott et al. | |
| 2008/0111565 A1 | 5/2008 | Ausserlechner et al. | |
| 2009/0108839 A1 | 4/2009 | Ausserlechner | |
| 2009/0256559 A1* | 10/2009 | Ausserlechner et al. | 324/251 |
| 2010/0123458 A1 | 5/2010 | Schott | |

(Continued)

FOREIGN PATENT DOCUMENTS

EP    0735600 A2    10/1996
EP    2071347 A2    6/2009

(Continued)

OTHER PUBLICATIONS

Notice of Allowance dated Dec. 31, 2013 for U.S. Appl. No. 13/541,863. 14 Pages.

(Continued)

*Primary Examiner* — Arleen M Vazquez
*Assistant Examiner* — Brent J Andrews
(74) *Attorney, Agent, or Firm* — Eschweiler & Associates, LLC

(57) ABSTRACT

A vertical Hall device includes a Hall effect region formed in a substrate and a sequence of at least six contacts arranged in or at a surface of the Hall effect region between a first contact and a last contact. The vertical Hall device also includes a first contact interconnection connecting the first contact with a third to the last contact. A vertical Hall device further includes a second contact interconnection connecting a third contact with the last contact. Further embodiments made to a sensing method for sensing a magnetic field parallel to a surface of a substrate.

25 Claims, 18 Drawing Sheets

(56) References Cited

U.S. PATENT DOCUMENTS

| | | | |
|---|---|---|---|
| 2010/0133632 A1* | 6/2010 | Schott | 257/427 |
| 2010/0252900 A1 | 10/2010 | Minixhofer et al. | |
| 2011/0187350 A1 | 8/2011 | Ausserlechner et al. | |
| 2012/0016614 A1* | 1/2012 | Hohe et al. | 702/85 |
| 2012/0056609 A1 | 3/2012 | Satoh | |
| 2012/0241887 A1 | 9/2012 | Schott et al. | |
| 2013/0015853 A1 | 1/2013 | Raz et al. | |
| 2013/0342196 A1 | 12/2013 | Ausserlechner | |

FOREIGN PATENT DOCUMENTS

| | | | |
|---|---|---|---|
| EP | 2192417 | A2 | 6/2010 |
| WO | 03036733 | A2 | 5/2003 |
| WO | 2004025742 | A1 | 3/2004 |

OTHER PUBLICATIONS

M. Banjevic: "High Bandwith CMOS Magnetic Sensors Based on the Miniaturized Circular Vertical Hall Device." Master Thesis Presented Sep. 9, 2011.

C. Schott: "Linearizing integrated Hall Devices." International Conference on Solid State Sensors and Actuators. Jun. 16-19, 1997.

T. Kaufmann et al: "Novel complying concept for five-contact vertical hall devices", Transducers 2011, pp. 2855-2858. Jun. 5-9, 2011.

J. Cesaretti, Master Thesis. Georgia Institute of Technology. May 2008.

M. Denieve et al: Reference magnetic actuator for self calibration of a very small Hall sensor array. Swiss Federal Institute of Technology. Jun. 11, 2001.

Tamuracorp. "Current Sensor Info." Retrieved from tamuracorp. com/products/current-sensor-info. Retreived on Apr. 27, 2012.

T. Kaufmann et al.: "Piezo-Hall effect in CMOS-based Vertical Hall Devices." Department of Microsystems Engineering (IMTEK) University of Freiburg Freiburg, Germany. IEEE Copyright 2011.

Michael Demierre. "Improvements of CMOS Hall Microsystems and Application for Absolute Angular Position Management." Sep. 2003.

R. Popovic "Hall devices for magnetic sensor systems",Transducers'97, pp. 377-380. International Conference on Solid State Sensors and Actuators. Jun. 16-19, 1997.

U.S. Appl. No. 13/530,235, filed Jun. 22, 2012.

U.S. Appl. No. 13/541,863, filed Jul. 5, 2012.

Office Action dated Apr. 2, 2013 for U.S. Appl. No. 13/541,863.

Non-Final Office Action dated Jul. 21, 2014 for U.S. Appl. No. 13/530,235.

Non Final Office Action Dated May 27, 2015 U.S. Appl. No. 14/596,436.

Notice of Allowance Dated Nov. 7, 2014 U.S. Appl. No. 13/530,235.

U.S. Appl. No. 14/596,436, filed Jan. 14, 2015.

Notice of Allowance Dated Nov. 6, 2015 U.S. Appl. No. 14/596,436.

* cited by examiner

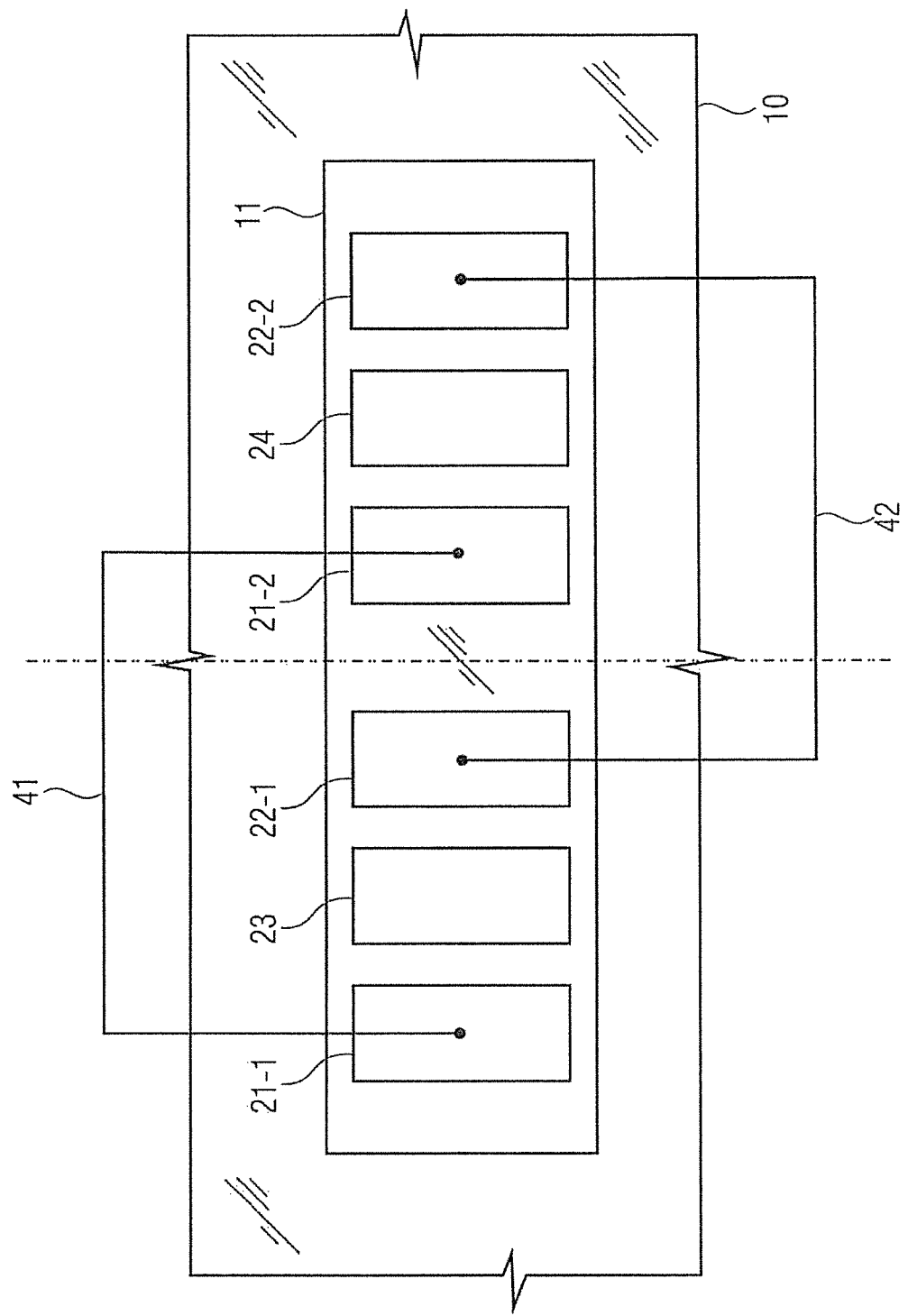

VERTICAL HALL DEVICE COMPRISING FIRST AND SECOND CONTACT INTERCONNECTIONS

FIELD

Embodiments of the present invention relate to a vertical Hall device. Further embodiments of the present invention relate to a sensing method for sensing a magnetic field parallel to a surface of a substrate. Further embodiments of the present invention relate to 6-contact vertical Hall devices and/or 7-contact vertical Hall devices.

BACKGROUND

Vertical Hall sensors typically comprise a Hall effect region that is formed within a substrate, such as a semiconductor substrate. Vertical Hall sensors respond to magnetic field components parallel to the substrate or, more precisely, parallel to a main surface of the substrate.

Typically, vertical Hall sensors have one problem in common, namely an offset error. The offset is the output signal in the absence of the magnetic field or the component thereof which the sensor should detect. The origin of the offset error is basically a slight asymmetry of the device. The so-called spinning current technique may be used to reduce the offset error of Hall devices. The spinning current technique was initially devised to be applied to horizontal Hall devices or "Hall plates": in subsequent clock phases the roles of supply and sense terminals of the Hall plate are exchanged. The output signals of the Hall plate in two clock phases are added or subtracted so that the offset (i.e., the zero point error) cancels and a strong signal with respect to the prevailing magnetic field remains.

The offset cancellation works all the better the higher the symmetry of the Hall plate or Hall device is. Therefore, Hall plates typically have a 90° symmetry, for example, squares, crosses or octagons. Vertical Hall devices on the other hand are typically less symmetric and therefore spinning current techniques are not as efficient for vertical Hall devices than for Hall plates (horizontal Hall devices).

SUMMARY

Embodiments of the present invention provide a vertical Hall device comprising a Hall effect region, a sequence of at least six contacts, a first contact interconnection and a second contact interconnection. The Hall effect region is formed in a substrate. The sequence of at least six contacts is arranged in or at a surface of the Hall effect region between a first contact and a last contact. The first contact interconnection connects the first contact with a third-to-the-last contact. The second contact interconnection connects a third contact with the last contact.

Further embodiments of the present invention provide a vertical Hall device comprising a Hall effect region formed in a substrate, a first group of at least three contacts arranged in or at a surface of the Hall effect region, a second group of at least three contacts arranged in or at the surface of the Hall effect region, a first contact interconnection and a second contact interconnection. The Hall effect region is symmetric with respect to at least one symmetry axis that is parallel to the surface of the substrate. The first group of at least three contacts is arranged at a first side of the at least one symmetry axis. The first group of contacts is ordered in a descending order regarding respective distances of the at least three contacts relative to the symmetry axis. The second group of at least three contacts is arranged at a second side of the at least one symmetry axis. The second group of contacts is symmetrical to the first group of contacts relative to the at least one symmetry axis and ordered in a descending order regarding respective distances of the at least three contacts within the second group relative to the symmetry axis. The first contact interconnection connects a first contact of the first group of contacts with a third contact of the second group of contacts. The second contact interconnection connects a third contact of the first group of contacts with a first contact of the second group of contacts.

Further embodiments of the present invention provide a vertical Hall device comprising a Hall effect region formed in a substrate and having a longitudinal axis, a first pair of interconnected contacts, a second pair of interconnected contacts, a first intermediate contact and a second intermediate contact. The first pair of interconnected contacts is arranged in or at a surface of the Hall effect region and configured to function as supply contacts during a first clock phase of a spinning current scheme. During a second clock phase of the spinning current scheme the first pair of interconnected contacts is configured to function as sense contacts. The second pair of interconnected contacts is arranged in or at the surface of the Hall effect region and configured to function as supply contacts during the first clock phase of the spinning current scheme and as sense contacts during the second clock phase of the spinning current scheme. The first and second pairs of interconnected contacts overlap regarding a distribution of the contacts along the longitudinal axis of the Hall effect region. The first intermediate contact is arranged in or at the surface of the Hall effect region adjacent to a first contact of the first pair and to a first contact of the second pair of interconnected contacts. The first intermediate contact is configured to function as a sense contact during the first clock phase of the spinning current scheme. A second intermediate contact is arranged in or at the surface of the Hall effect region adjacent to a second contact of the first pair and a second contact of the second pair of interconnected contacts. The second intermediate contact is configured to function as a sense contact during the first clock phase (just like the first intermediate contact).

Further embodiments of the present invention provide a sensing method for sensing a magnetic field parallel to a surface of a substrate. The method comprises applying an electrical supply to a Hall effect region formed in the substrate. A sequence of contacts is arranged in or at a surface of the Hall effect region between a first contact and a last contact of the sequence of contacts. The first contact is connected to a third to the last contact by a first contact interconnection. A third contact is connected to the last contact by a second contact interconnection. The sensing method further comprises sensing at least one sense signal at a second contact and a second-to-the-last contact of the sequence of contacts. The method also comprises applying the electrical supply to the second contact and the second to the last contact. Furthermore, the sensing method comprises sensing at least one further sense signal at the first contact which is interconnected to the third to the last contact and at the third contact which is interconnected to the last contact. The sensing method further comprises determining an output signal indicative of the magnetic field based on the at least one sense signal and the at least one further sense signal.

Further embodiments of the present invention provide a sensing method for sensing a magnetic field parallel to a surface of a substrate in which a Hall effect region is formed. The Hall effect region has a longitudinal axis. The sensing method comprises applying an electrical supply to a first pair of contacts and a second pair of contacts arranged in or at a surface of the Hall effect region. The first and second pairs of contacts overlap regarding a distribution of the contacts along the longitudinal axis of the Hall effect region. The sensing method also comprises sensing at least one sense signal at least at a first intermediate contact and a second intermediate contact arranged in or at the surface of the Hall effect region. The first intermediate contact is adjacent to a first contact of the first pair of contacts and also adjacent to a first contact of the second pair of contacts. The second intermediate contact is adjacent to a second contact of the first pair of contacts and also adjacent to a second contact of the second pair of contacts. The sensing method further comprises applying the electrical supply to the first intermediate contact and the second intermediate contact. The sensing method also comprises sensing at least one further sense signal at the first pair of contacts and the second pair of contacts. Furthermore, the sensing method comprises a determination of an output signal indicative of the magnetic field based on the at least one sense signal and the at least one further sense signal.

BRIEF DESCRIPTION OF THE FIGURES

Embodiments of the present invention will be described using the accompanying figures in which:

FIG. 5B shows a schematic top view of a vertical Hall device from FIG. 5A;

DETAILED DESCRIPTION

Before in the following embodiments of the present invention will be described in detail using the accompanying figures, it is to be pointed out that the same elements or elements having the same functionality are provided with the same or similar reference numbers and that a repeated description of elements provided with the same or similar reference numbers is typically omitted. Hence, descriptions provided for elements having the same or similar reference numbers are mutually exchangeable. In the following description, a plurality of details are set forth to provide a more thorough explanation of embodiments of the present invention. However, it will be apparent to one skilled in the art that embodiments of the present invention will be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

One possible technique for improving the symmetry of a vertical Hall device is to provide several highly similar vertical Hall effect regions wherein the supply contacts and the sense contacts of the individual vertical Hall effect regions are permuted among the several vertical Hall effect regions. According to an example of such a method for symmetrization, several vertical Hall effect regions are connected together in such a way that the complete arrangement becomes symmetric: if a Hall effect region has n contacts, n Hall plates are connected together by shorting the i-th contact of Hall effect region #1 with the C(i+1)-th contact of Hall plate #2, with the (i+2)-th contact of Hall effect region #3 . . . , and so on . . . with the (i+n)-th contact of Hall effect region #n. This procedure is done for i=1 . . . n so that the overall arrangement has n contacts or terminals. Since all types of contacts are tied together, the circuit is symmetric in a sense that all nodes have the same input resistance.

Another option is to use an arrangement with identical basic Hall devices or Hall effect regions, yet different connection and operation of the basic Hall devices: such a basic Hall device includes a Hall tub or Hall effect region with four contacts. Two non-neighboring contacts are used as supply terminals and the other two are used as sense terminals in a first clock phase of a spinning current scheme. In a second clock phase they are exchanged. The disadvantage of this device is the lack of symmetry and therefore the voltage between both sense terminals has a huge value even at a vanishing magnetic field location (i.e., huge offset error).

Although in a second clock phase of the spinning current scheme the offset has a different sign, it does not cancel in practice due to the non-linearity of the basic device.

Figure 1:
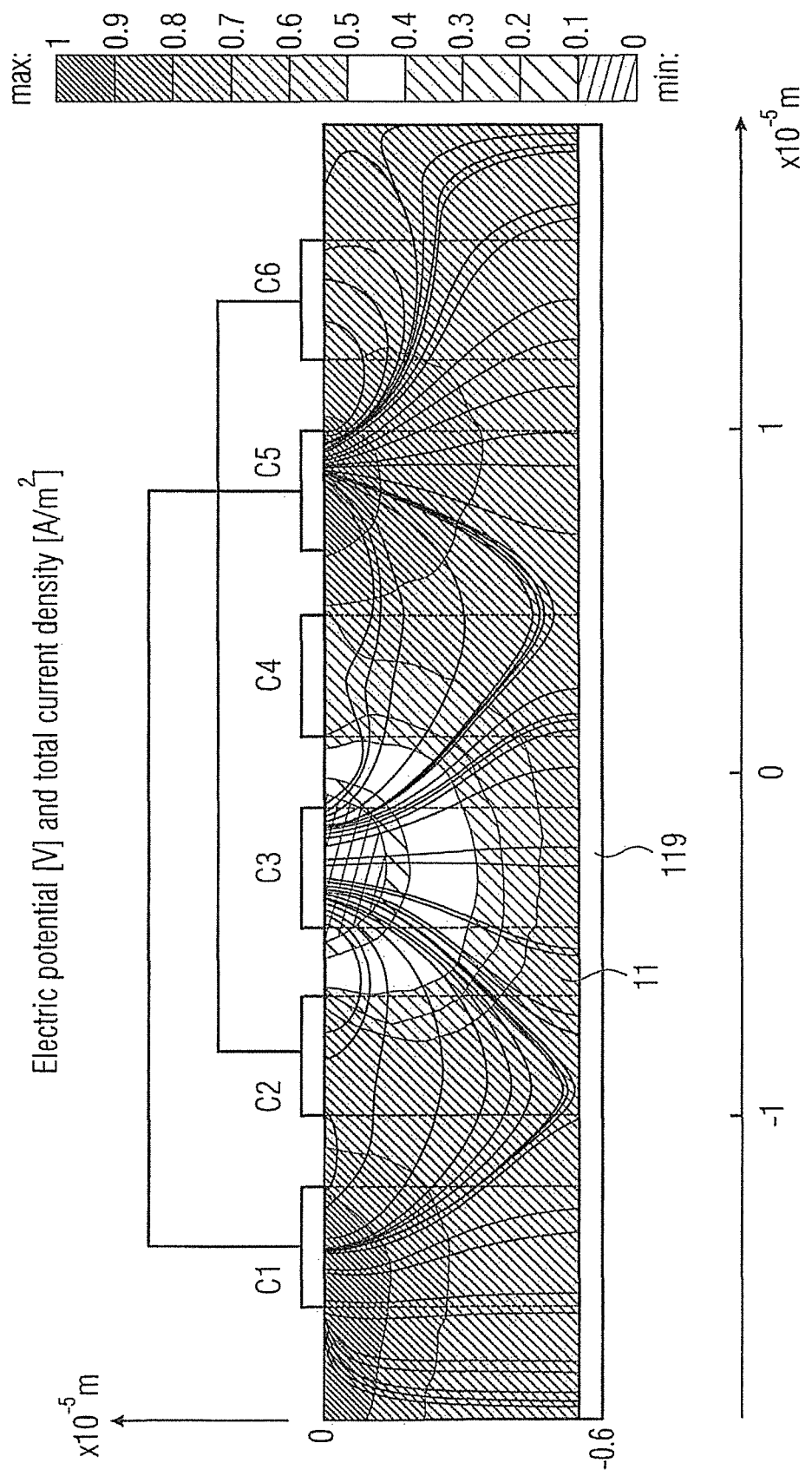
FIG. 1 shows a schematic cross-section of a vertical Hall device according to a reference design in which the results of a numerical simulation of an electrical potential and a current density is illustrated.

FIG. 1 shows a schematic cross-section through a vertical Hall effect region which may be regarded as a reference vertical Hall region. The reference vertical Hall effect region schematically illustrated in FIG. 1 may be compared with vertical Hall sensors according to embodiments to be described below so that the differences of the embodiments compared to other vertical Hall sensor designs can be more readily appreciated. In particular, an electrical potential and a current density within the vertical Hall effect region is shown in FIG. 1.

The vertical Hall device shown in FIG. 1 comprises a vertical Hall region 11 and a plurality of six contacts C1 to C6. The intention of the design of the reference vertical Hall device shown in FIG. 1 was to increase the symmetry of the vertical Hall device by shorting each of the outmost contacts C1 and C6 with the opposite second outmost contacts C5 and C2, respectively.

The numerical simulation was performed using the following parameters: all contacts C1 to C6 2.5 μm long, spacing between contacts=1.5 μm, depth of Hall effect region=5.5 μm, width of device=3 μm. During a first clock phase of the spinning current scheme the contacts are connected as follows. Contact C1 is connected to a high supply potential, e.g., 1V. Contact C5 is shorted to contact C1 and therefore also at the high supply potential. Contacts C2 and C6 are floating and may be used as sense contacts during clock phase 1 of the spinning current scheme. Contact C3 is connected to a low supply potential, e.g., 0V (ground). Contact C4 is another floating contact during clock phase 1 and may be used as the other sense contact. The vertical Hall effect region 11 is bounded at a bottom boundary surface (inner boundary surface) by a n-doped buried layer (nBL) 119 which typically has a higher electrical conductivity than the vertical Hall effect region 11.

By integrating the current density over the surface of the contact C1, the total electrical current flowing via contact C1 into the vertical Hall effect region 11 can be determined from the numerical simulation as 82.4 μA. The electrical current flowing via contact C5 into the vertical Hall effect region 11 can be determined as 102.8 μA. The sum of the currents at the contacts C1 and C5 is 185.2 μA. The electrical current that leaves the vertical Hall effect region 11 at contact C3 is 188.6 μA. The difference between the sum of the currents at contacts C1 and C5 and the current at contact C3 is assumed to be due to leakage currents and/or numerical errors of the numerical simulation. With these values the input resistance between contacts C1, C5 and contact C3 can be estimated at 5354.5Ω.

The numerical simulation also provides the potential of the first sense terminal C2, C6 as 0.688 V. The potential of the second sense terminal C4 is 0.605 V. The difference is 83.595 mV and represents the offset voltage of the vertical Hall sensor of FIG. 1.

Now let us assume the magnetic field (Bz-field) which is perpendicular to the drawing plane of FIG. 1. At Bz=+100 mT, the potential of the first sense terminal C2, C6 is 0.686 V, whereas the potential of the second sense terminal C4 is 0.608 V. The voltage related magnetic sensitivity Su can thus be determined as Su=0.05376/T at 1V Hall supply voltage.

Note that the potential excursion due to Bz-field is 49% larger at C4 than at C2, C6, namely 32.1 mV/V/T versus 21.6 mV/V/T.

Figure 2:
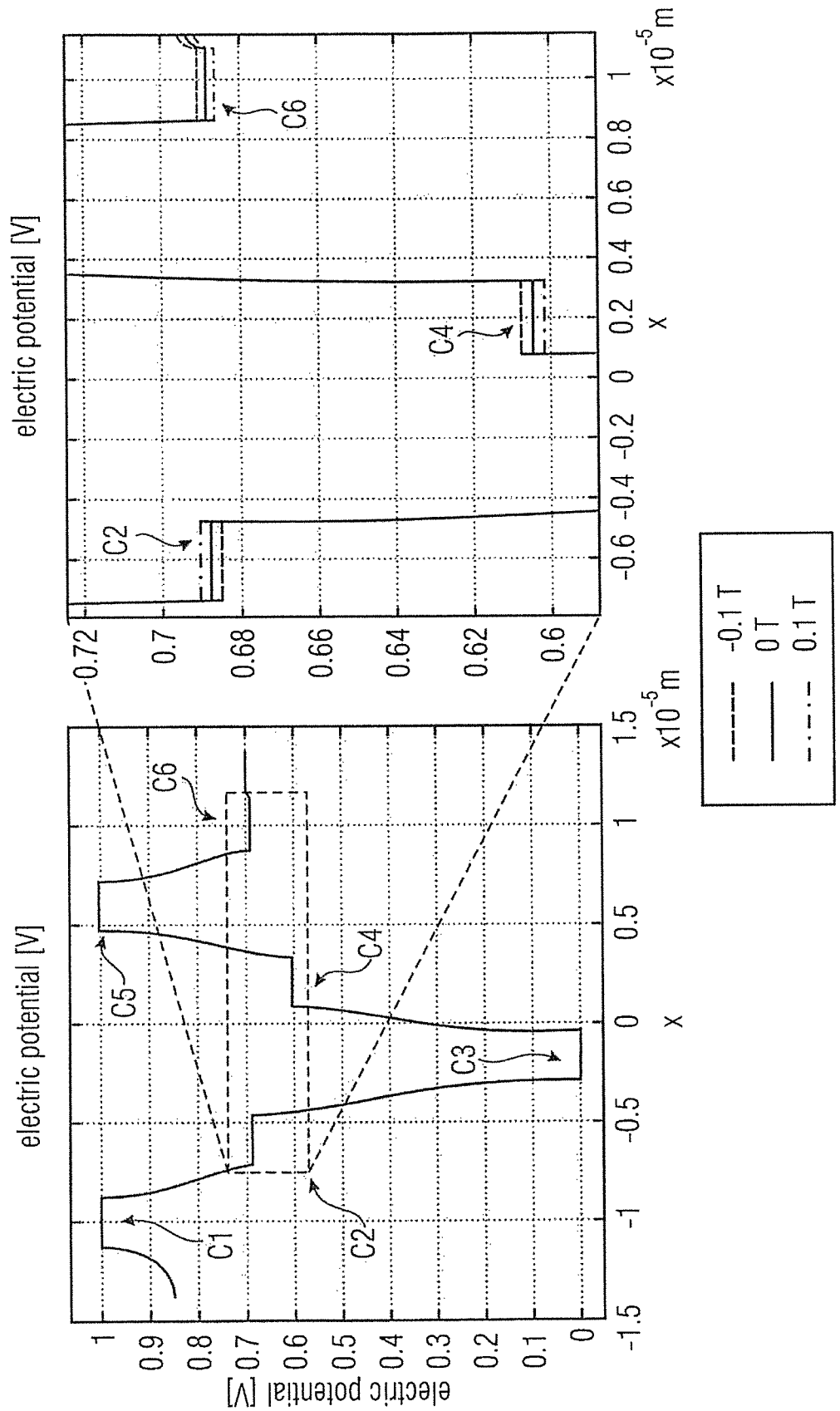
FIG. 2 is a graphical representation of a potential distribution along the surface of the device from FIG. 1 for a first clock phase of a spinning current scheme.

FIG. 2 illustrates a potential distribution along the surface of the device during the first clock phase of the spinning current scheme, which is also a product of the numerical simulation. The left diagram in FIG. 2 shows the overall potential distribution from the left edge to the right edge and the entire range of the potential from 0 V to 1 V. The right part of FIG. 2 shows in an enlarged manner the potential distribution at the three sense contacts C2, C4 and C6. The graphs in FIG. 2 are drawn for three different strengths of the magnetic field Bz. However, in the large scale representation of the left diagram in FIG. 2 the three curves appear to be substantially identical so that only one curve is drawn. In the right part of FIG. 2 a distinction is made between the three different curves so that a full stroke line corresponds to the 0 T case (zero magnetic field), a dashed line corresponds to the −0.1 T case and a dash-dot line corresponds to the 0.1 T case.

Figure 3:
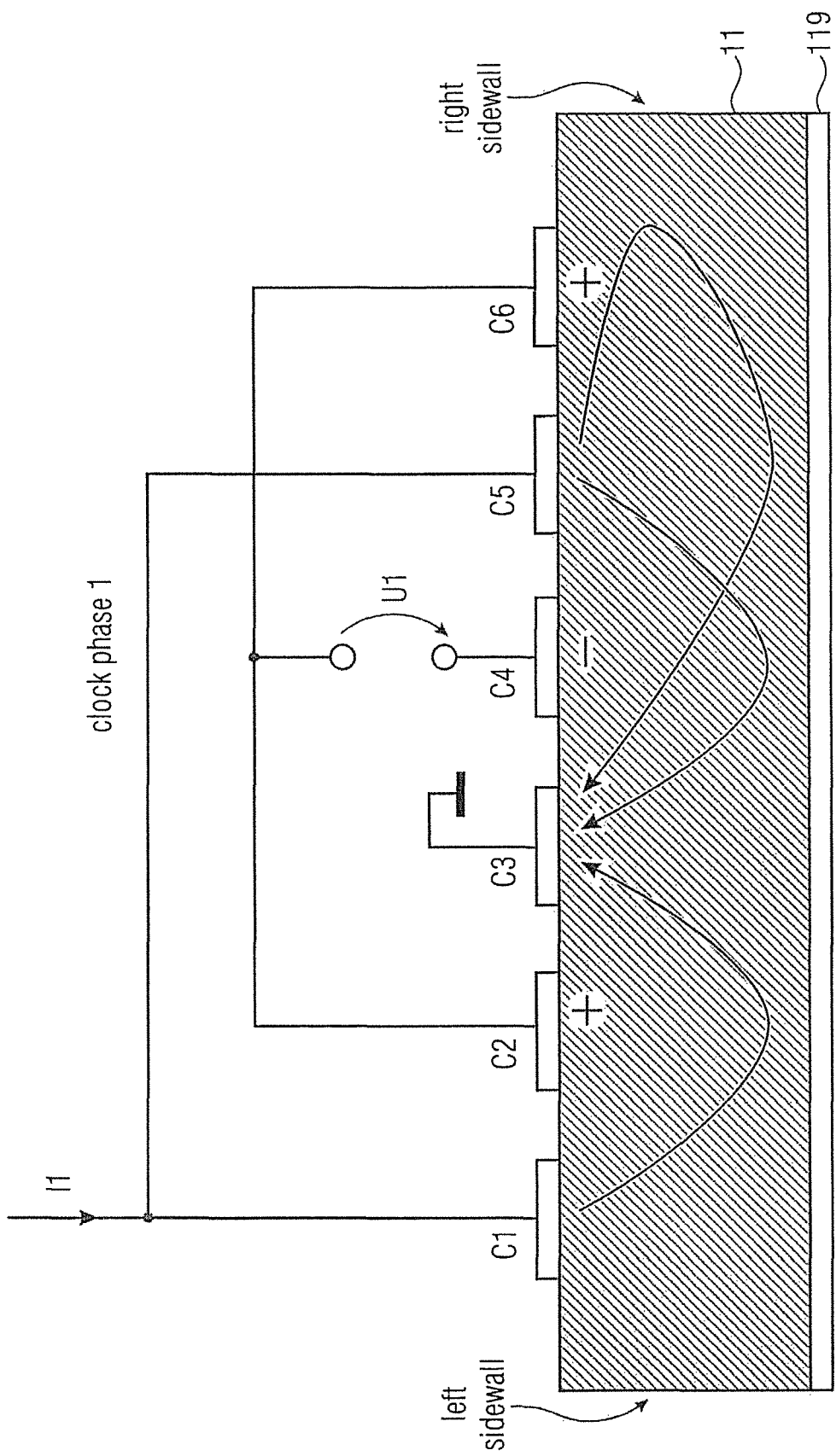
FIG. 3 shows a schematic cross-section of the vertical Hall device of FIG. 1 and schematic principle current flows therein during the first clock phase of the spinning current scheme.
Figure 4:
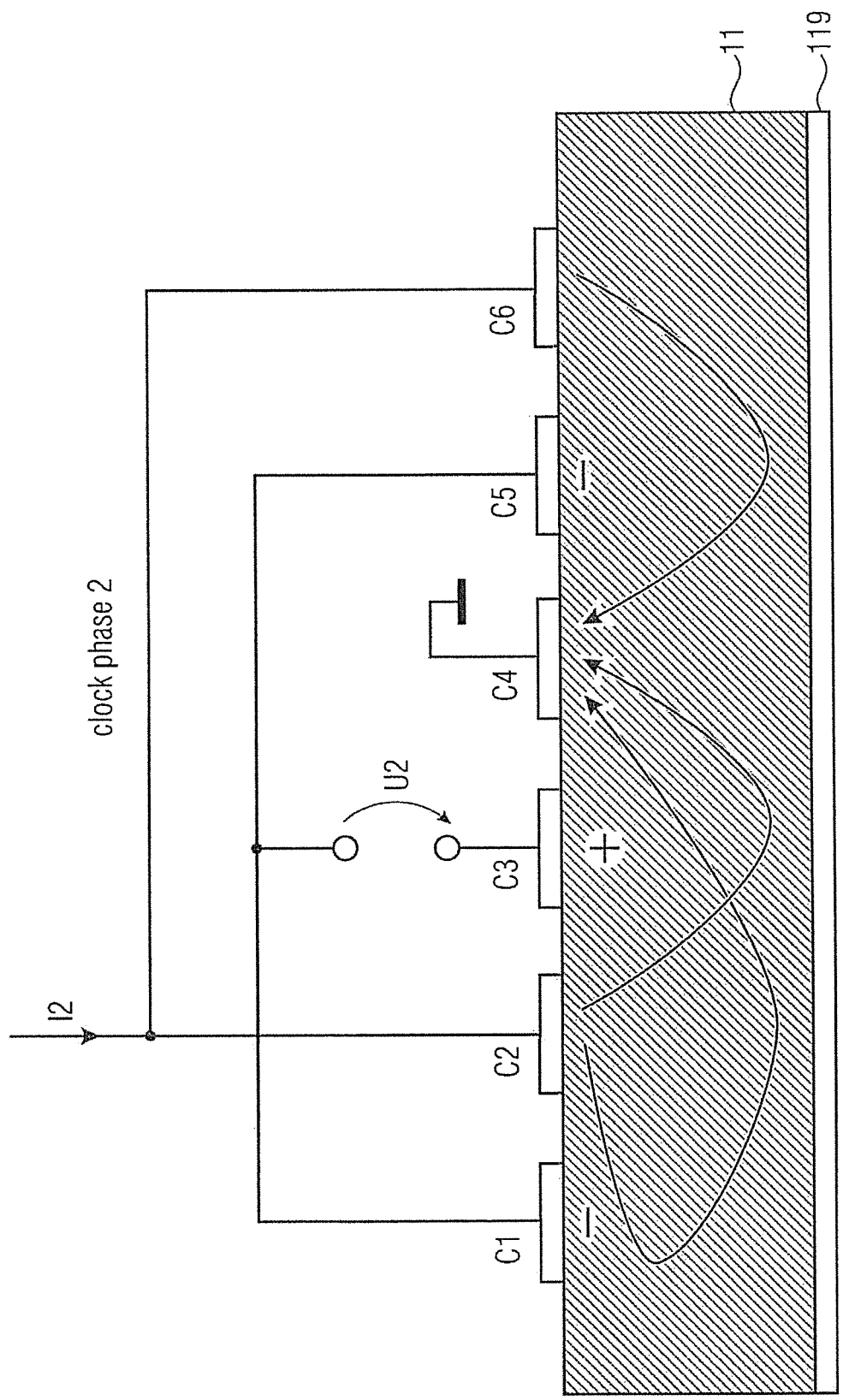
FIG. 4 shows a schematic cross-section of the vertical Hall device of FIG. 1 and the schematic principle current flows therein during a second clock phase of the spinning current scheme.

FIG. 3 shows a schematic cross-section of the Hall sensor from FIG. 1 during the first clock phase. FIG. 4 shows a schematic cross-section of the vertical Hall sensor from FIG. 1 during a second clock phase of the spinning current scheme. During the first clock phase the supply current I1 is supplied to the contacts C1 and C5. The contact C3 is connected to ground so that the supply current I1 flows along substantially arc-shaped trajectories from the contacts C1 and C5 to the contact C3. A first sense signal U1 can be measured between the short circuited contact pair C2, C6 and the intermediate contact C4.

During the second clock phase of the spinning current scheme which is schematically illustrated in FIG. 4, the supply current I2 is supplied to the short circuited contact pair C2, C6 and leaves the vertical Hall effect region 11 at the intermediate contact C4. A second sense signal U2 can be obtained between the short circuited contact pair C1, C5 and the intermediate contact C3. For a zero magnetic field Bz=0 the following inequalities are true: U1>0 and U2>0. If Bz increases, U1 increases and U2 decreases. Therefore, the total signal is U1−U2, which doubles the magnetic sensitivity and reduces the offset.

Even if the left and right side walls of the device affect the conductivity in the vertical Hall effect region 11, this does not lead to additional offset because the device is symmetric with respect to its centre. The left side wall is closer to contact C1 than the right side wall is to contact C5. Also the distance between contact C2 and the left side wall is larger than the distance between the contact C6 and the right side wall. However, contact C2 is shorted to contact C6 and contact C1 is shorted to contact C5. Therefore, the effective (average) distance between the contact pair C1, C5 to both side walls is equal to the effective (averaged) distance of the contact pair C2, C6 to both side walls. This results in a better symmetry of the device with respect to the side walls.

Note that some contacts are shorted, yet they are shorted permanently in all clock phases of the spinning current scheme. This effect is important for the spinning current scheme to cancel the offset more efficiently. Overall, the device has two supply terminals and two sense terminals, and all supply terminals of the first clock phase are used as sense terminals in the second clock phase and vice versa. This is also important for the spinning current scheme to reduce the offset efficiently.

The concept of the vertical Hall device shown in FIGS. 1 to 4 for reference purposes uses short circuits between two distant contacts to achieve symmetry. However, the fact that the two short circuited contact pairs C1, C5 and C2, C6 are neighbors leads to the situation that one of these contact pairs is a supply terminal and the other is a sense terminal. This causes an asymmetry in the sense terminals: one sense terminal is a short circuit of two contacts, i.e., a contact pair, while the other sense contact is a single contact. It is clear that this is an asymmetry so that it is difficult to achieve exactly equal potentials on both the sense contact pair and the single sense contact in the absence of magnetic fields.

Figure 5A:
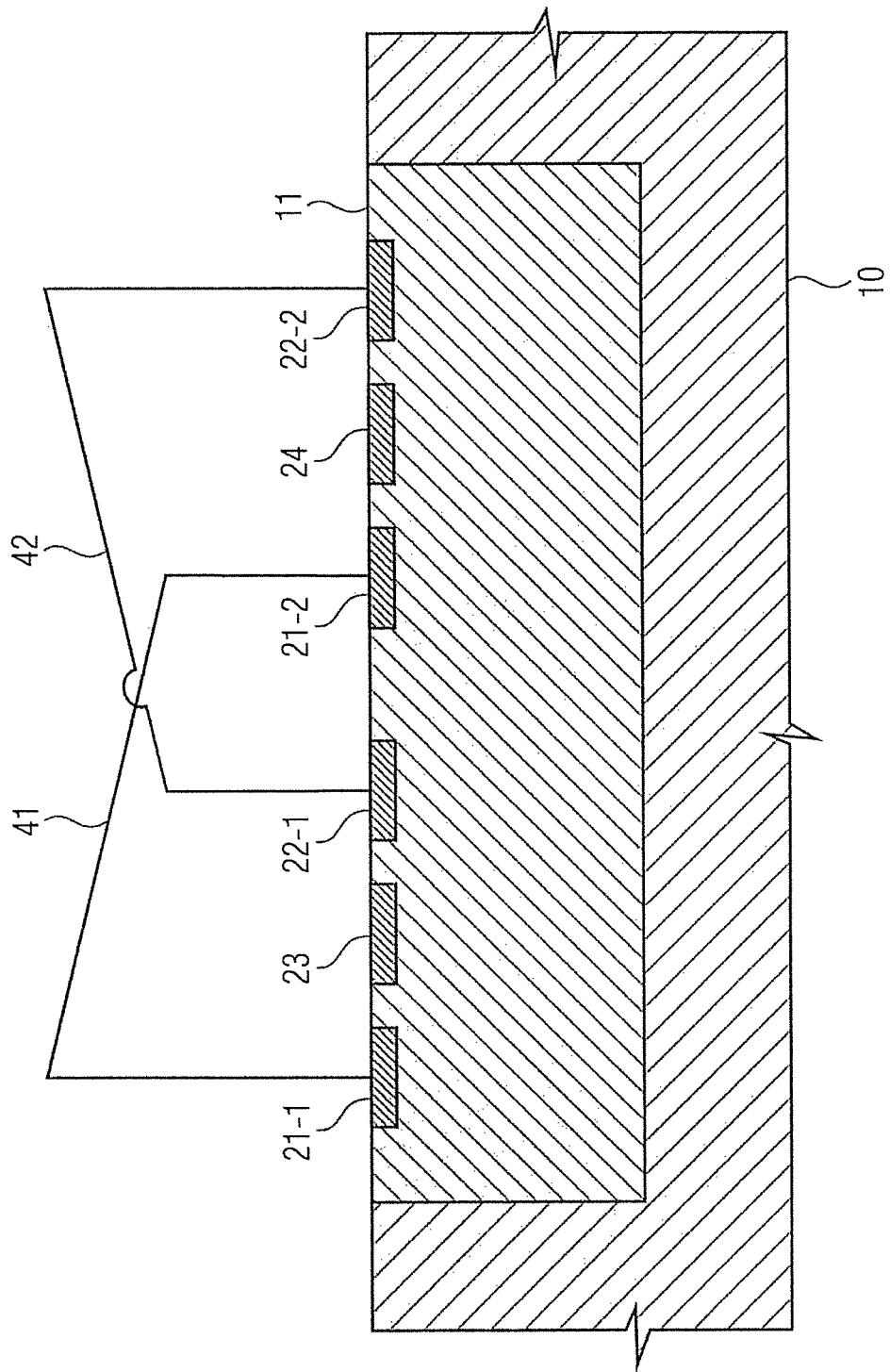
FIG. 5A shows a schematic cross-section of a vertical Hall device according to embodiments.

FIG. 5A shows a schematic cross-section and FIG. 5B shows a schematic top view of a vertical Hall device according to embodiments. The vertical Hall device according to FIGS. 5A and 5B also uses short circuits or contact bridges. Each short circuit is between two contacts. A difference to the reference design illustrated for comparison purposes in FIGS. 1 to 4 is that in the embodiment according to FIGS. 5A and 5B the two short circuits are not neighbors anymore. Therefore, they can both be sense terminals in one clock phase and supply terminals in another clock phase. It is assumed that this should make it easier to have identical potentials at the sense contacts at zero magnetic field.

The vertical Hall device schematically illustrated in FIGS. 5A and 5B comprises a Hall effect region 11 formed in a substrate 10. The vertical Hall device further comprises a sequence of at least six contacts 21-1, 23, 22-1, 21-2, 24 and 22-2. The sequence of at least six contacts are arranged in or at a surface of the Hall effect region 11 between a first contact 21-1 and a last contact 22-2. The position of a particular contact within the sequence of the at least six contacts depends on a location of the contact within or at the surface of the Hall effect region 11.

The sequence of at least six contacts does not necessarily have to be arranged along a straight line but may also be arranged along an arc or a curve. One option for defining the sequence path may be as follows: determine the two contacts which are distanced the most from each other in terms of a distance running exclusively within the vertical Hall effect region 11. One of the determined two contacts may then be selected as the first contact and the other contact may be selected as the last contact (typically it does not matter which contact is selected as the first contact, due to symmetry). When connecting the imaginary voltage source or current source to the first contact and the last contact, a current flow and a corresponding potential distribution will occur within the vertical Hall effect region 11. The sequence may then be defined on the basis of the electrical potentials occurring at the various contacts of the sequence of at least six contacts. In other words, the first contact is a contact at which the highest electrical potential (typically the positive supply potential) can be observed. The second contact in the sequence of contacts is the contact with the second highest electrical potential in the above described configuration. In this manner, the contact of the sequence of at least six contacts can be assigned ordinal numbers until the last contact is reached. This concept can be explained using FIG. 5A. The contacts 21-1 and 22-2 are the two most distant contacts among the six contacts shown in 5A. When supplying an electrical current to contact 21-1 (but not to contact 21-2) and extracting this current at contact 22-2 (but not at contact 22-1), then a distribution of the electrical potential within the vertical Hall effect region 11 will result wherein the highest electrical potential is immediately adjacent to contact 21-1 and the lowest electrical potential is immediately adjacent to contact 22-2. In between the first contact 21-1 and the last contact 22-2 the electrical potential decreases and it is readily recognizable that the electrical potential is higher at contact 23 than at the contacts 22-1, 21-2 and 24. This concept of determining the sequence of at least six contacts is an example only but can be applied to vertical Hall effect regions having a more complicated shape such as an angle shape, an arc shape, a quarter circular shape, a semi-circular shape, a ziz-zag shape or a serpentine shape. Typically but not necessarily, the vertical Hall effect region is a simply connected region.

The vertical Hall device further comprises a first contact interconnection 41 connecting the first contact 21-1 with a third-to-the-last contact 21-2. The vertical Hall device further comprises a second contact interconnection 42 that connects a third contact 22-1 with the last contact 22-2.

The vertical Hall device schematically illustrated in FIGS. 5A and 5B may also be described as comprising a Hall effect region 11 formed in a substrate 10, the Hall effect region 11 being symmetric with respect to at least one symmetry axis that is parallel to a surface of the substrate. The symmetry axis is schematically illustrated in FIG. 5B as a dash-dot-dot line. The vertical Hall device also comprises a first group of at least three contacts 21-1, 23 and 22-1 which are arranged in or at a surface of the Hall effect region 11 at a first side of the at least one symmetry axis. The first group of contacts is ordered in a descending order regarding their respective distances relative to the symmetry axis. Contact 21-1 is the most distant contact to the symmetry axis so that contact 21-1 becomes the first contact of the first group of at least three contacts. In an analog manner contact 23 becomes the second contact of the first group of contacts and the contact 22-1 becomes the third contact of the first group of contacts.

The vertical Hall device also comprises a second group of at least three contacts which are arranged in or at a surface of the Hall effect region 11 at a second side of the at least one symmetry axis. The second group of contacts is symmetrical to the first group of contacts relative to the at least one symmetry axis. Also the contacts of the second group of at least three contacts are ordered in a descending order regarding their respective distances relative to the symmetry axis. Hence, the contact 22-2 is the first contact of the second group, the contact 24 is the second contact of the second group and the contact 21-2 is the third contact of the second group of at least three contacts. The vertical Hall device further comprises a first contact interconnection 41 connecting the first contact 21-1 of the first group of contacts with the third contact 21-2 of the second group of contacts. In a similar manner a second contact interconnection 42 connects the third contact 22-1 of the first group of contacts with the first contact 22-2 of the second group of contacts.

The first and second contact interconnections (also referred to as "shorts" or "short circuits" throughout this description) are symmetric to the center of the vertical Hall device.

Therefore, the leftmost contact (first contact of the first group) 21-1 is connected with the third contact from the right side (third contact of the second group) 21-2 via the first contact interconnection 41. In a similar manner the right most contact (third contact of the second group) is connected or "shorted" with the third contact from the left (first contact of the second group) 22-1. In doing so there is (in the embodiment depicted in FIGS. 5A and 5B) exactly one contact between the two shorts 41, 42 at the left side (namely the second contact 23 from the left) and also at the right side (namely the second contact 24 from the right). If both shorts or contact interconnections 41, 42 are used as supply terminals, the two contacts 23, 24 between them act as sense terminals, for example during the first clock phase of the spinning current scheme. In this case it can be recognized by considering the current streamlines that both sense terminals 23, 24 experience an increasing electric potential with increasing magnetic field (because the current passes below the sense contacts in the same direction). This is symbolized in FIG. 7 (which will be described below) by the "plus sign" below each sense contact 23 and 24.

A vertical Hall device according to embodiments may also be described as comprising a Hall effect region 11 formed in a substrate 10. The Hall effect region 11 has a longitudinal axis or an imaginary center line. The longitudinal axis is typically a rectilinear line but may also be a curved line following a shape of the vertical Hall effect region 11, in particular if the vertical Hall effect region 11 has a more complex shape (angled, arced, zig-zag, serpentine, etc). The vertical Hall device further comprises a first pair of interconnected contacts 21-1 and 21-2. The contacts 21-1 and 21-2 are arranged in or at a surface of the Hall effect region 11 and are configured to function as supply contacts during a first clock phase of a spinning current scheme. During a second clock phase of the spinning current scheme the contacts 21-1 and 21-2 are configured to function as sense contacts. The vertical Hall device also comprises a second pair of interconnected contacts 22-1 and 22-2 which are also arranged in or at the surface of the Hall effect region 11 and configured to function as sense contacts during the first clock phase of the spinning current scheme and as supply contacts during the second clock phase of the spinning current scheme. The first and second pairs of contacts overlap regarding a distribution of the contacts along the longitudinal axis of the Hall effect region 11. This means that when moving along the longitudinal axis from the first contact 21-1 to the second contact 21-2 of the first pair of contacts, one passes the first contact 22-1 of the second pair of contacts. Likewise, when moving along the longitudinal axis from the first contact 22-1 to the second contact 22-2, one passes a second contact 21-2 of the first pair of contacts. Furthermore, it can be noted that the first pair of interconnected contacts 21-1, 22-2 spans a center of the vertical Hall effect region 11. Also, the second pair of interconnected contacts 22-1, 22-2 spans the center of the vertical Hall effect region 11.

The vertical Hall device further comprises a first intermediate contact 23 and a second intermediate contact 24 arranged in or at the surface of the Hall effect region 11. The first intermediate contact 23 is adjacent to a first contact 21-1 of the first pair and to a first contact 22-1 of the second pair of interconnected contacts. The first intermediate contact 23 is configured to function as a sense contact during the first clock phase of the spinning current scheme. The second intermediate contact 24 is adjacent to a second contact 21-2 of the first pair and also a second contact 22-2 of the second pair of interconnected contacts. The second intermediate contact 24 is also configured to function as a sense contact during the first clock phase. During the second clock phase of the first intermediate contact 23 and the second intermediate contact 24 may be configured to function as supply contacts for the vertical Hall effect region 11.

According to embodiments, there is a symmetry among the supply contacts and among the sense contacts in each clock phase of the spinning current scheme. During the first clock phase, two pairs of interconnected contacts 21-1, 21-2 and 22-1, 22-2 are used as supply contacts and two intermediate contacts 23, 24 are used as sense contacts. During the second clock phase the two pairs of interconnected contacts 21-1, 21-2 and 22-1, 22-2 are used as sense contacts, while the two intermediate contacts 23 and 24 function as supply contacts.

Figure 6:
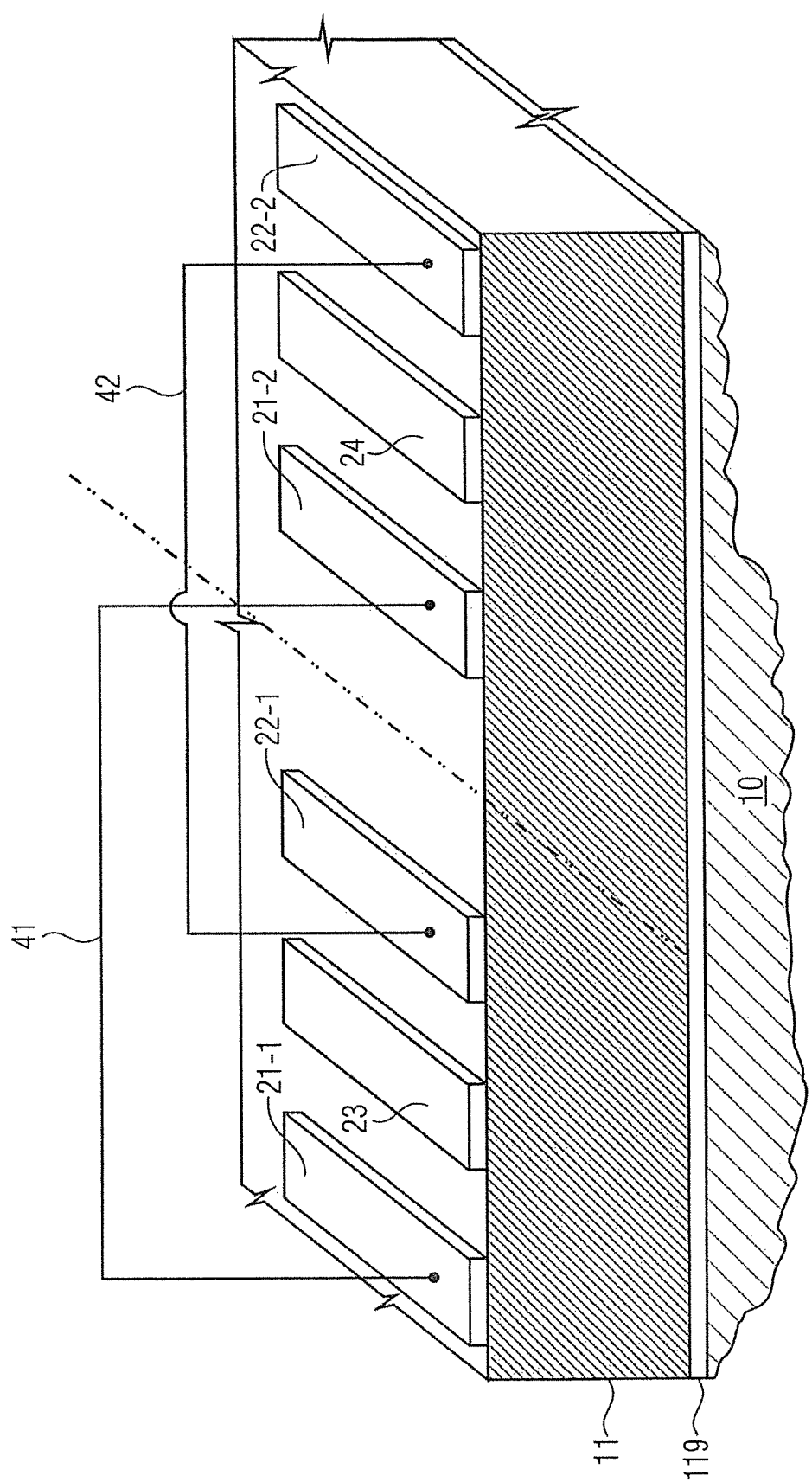
FIG. 6 shows a schematic, perspective section of a vertical Hall device according to at least some embodiments.

FIG. 6 shows a schematic, perspective cross-sectional view of a vertical Hall device according to embodiments. The contacts 21-1 to 22-2 (from left to right in FIG. 6) are arranged at a surface of the vertical Hall effect region 11. The vertical Hall device comprises an n-doped buried layer (nBL) 119 adjacent to the vertical Hall effect region 11 at a lower surface or interface which is typically parallel to the upper surface of the vertical Hall effect region 11 where the contacts 21-1 to 22-2 are arranged. Note that in most figures illustrating embodiments of the vertical Hall device, the contact interconnections 41 and 42, as well as further contact interconnections, are drawn in a schematic manner only. In particular, the contact interconnections 41 may be implemented as micro strip lines along the surface of the semiconductor substrate 10 surrounding the vertical Hall effect region 11. As schematically indicated in FIG. 5B, the first contact interconnection 41 may be arranged at a first side of the vertical Hall effect region 11 and the second contact interconnection 42 may be arranged at an opposite side of the vertical Hall effect region 11. In this manner, an intersection of the two contact interconnections 41, 42 can be avoided. An intersection of the two contact interconnections 41, 42 may require that the two interconnections are implemented at least partially in different layers which may be detrimental to an electrical symmetry of the two contact interconnections 41 and 42.

Figure 7:
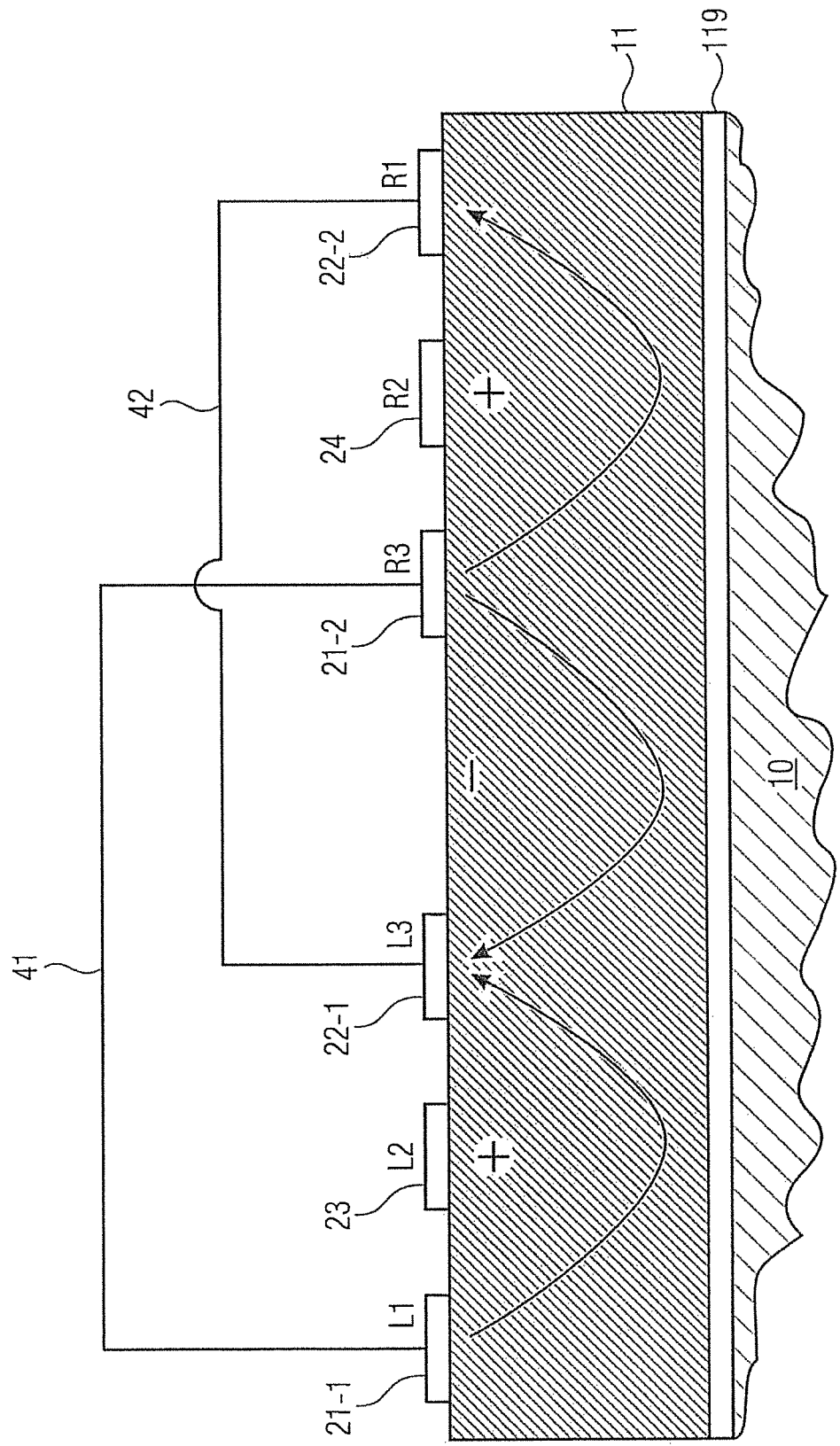
FIG. 7 shows a schematic cross-section of a vertical Hall device from FIG. 6 and the schematic main electrical current flows therein during a first clock phase of a spinning current scheme.

FIG. 7 shows a schematic cross-section of the vertical Hall device from FIG. 6. For easier reference, the contacts 21-1, 23 and 22-1 of the first group of at least three contacts are referenced by L1, L2 and L3, respectively (the letter L stands for "left"). The contacts 21-2, 24 and 22-2 of the second group of contacts are referred to as R3, R2 and R1, respectively (the letter R stands for "right"). FIG. 7 schematically illustrates the vertical Hall device according to embodiments during the first clock phase of the spinning current scheme. Accordingly, the contacts L1 and R3 are connected to a high supply potential (e.g., 1V) and the contacts L3 and R1 are connected to a low supply potential (e.g., 0V). A first portion of the supply current flows within the vertical Hall effect region 11 from the first contact L1 of the sequence of contacts to the third contact L3. A second portion of the supply current flows from the third-to-the-last contact R3 to the third contact L3 of the sequence of contacts. A third portion of the supply current flows from the third-to-the-last contact R3 to the last contact R1 within the vertical Hall effect region.

The potentials at the contacts L2 and R2 are roughly at half the supply voltage of the device. For example, if a supply voltage of 1V is supplied to the pair of interconnected contacts L1 and R3 while the second pair of interconnected contacts L3 and R1 is tied to ground (i.e., 0V), the potentials at the contacts L2 and R2 are roughly at 0.5V at zero magnetic field. If the vertical Hall effect region 11 would not be bounded at the left and right side, then the contacts L2 and R2 would be exactly at 0.5V. Due to the asymmetry caused by the left and right side walls of the vertical Hall effect region 11, the contact L2 is at an electric potential slightly below 0.5V and the contact R2 is at an electric potential slightly above 0.5V.

Figure 8:
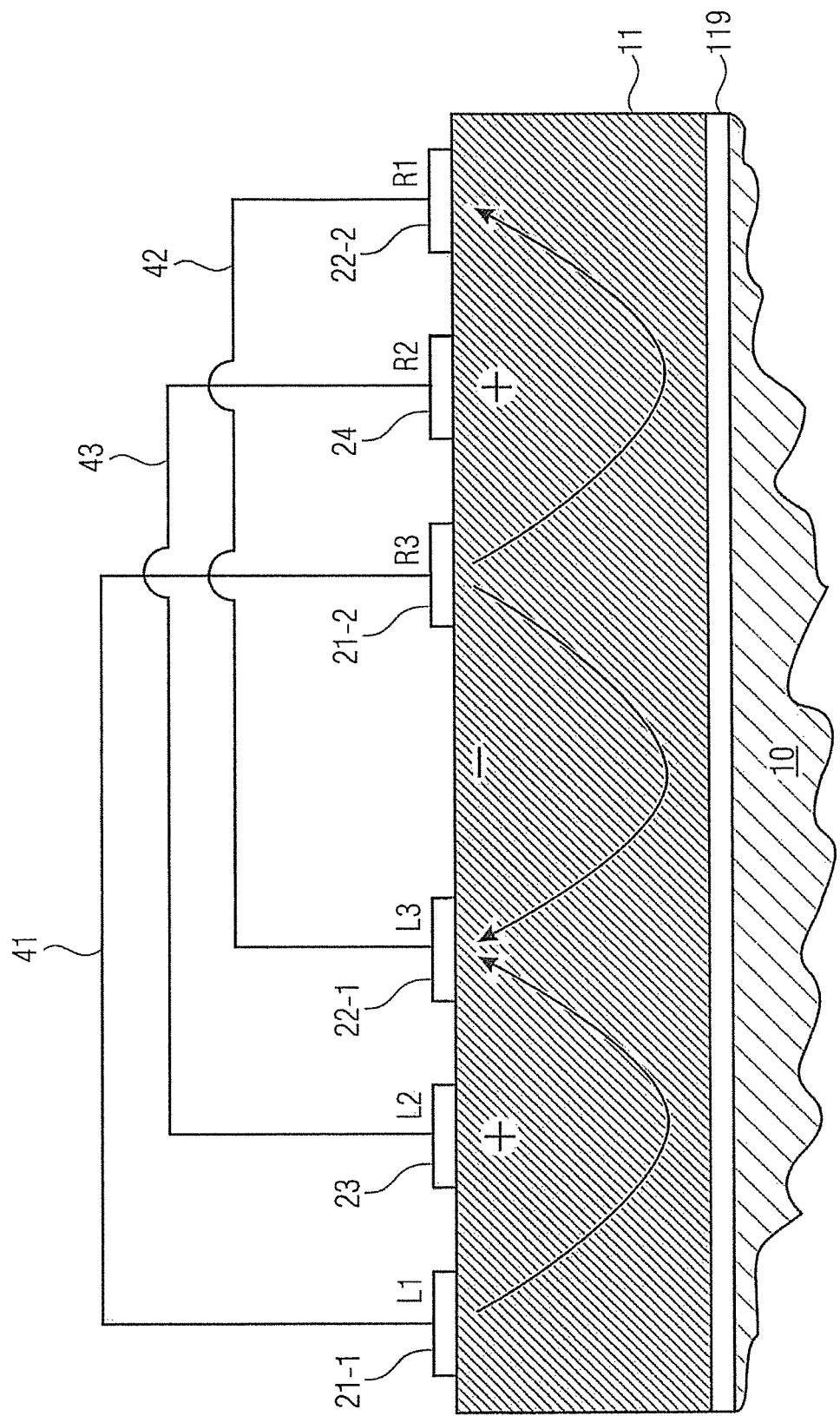
FIG. 8 shows a schematic cross-section of a vertical Hall device according to further embodiments and representative current flows therein valid for a first clock phase of a spinning current scheme.

FIG. 8 shows a schematic cross-section of the vertical Hall device according to embodiments similar to the embodiment shown in FIG. 7. The embodiment of FIG. 8 differs from the embodiment of FIG. 7 in that a third contact interconnection 43 is provided which connects the second contact L2 or 23 with the second-to-the-last contact R2 or 24. The third interconnection 43 balances the electric potentials at the contacts L2 and R2. In the zero magnetic field case, an electric potential of 0.5V can be established at the contacts L2 and R2, due to the short circuit of the two contacts L2 and R2.

Note that the short circuit of the contacts L2 and R2 does not (or at least not significantly) reduce the magnetic signal, i.e., an output signal of the vertical Hall sensor indicative of the magnetic field to be measured because even if the contacts L2 and R2 were not shorted, they would rise or fall synchronously if applied to the magnetic field (both contacts L2 and R2 are of the "plus sign" category).

Figure 9:
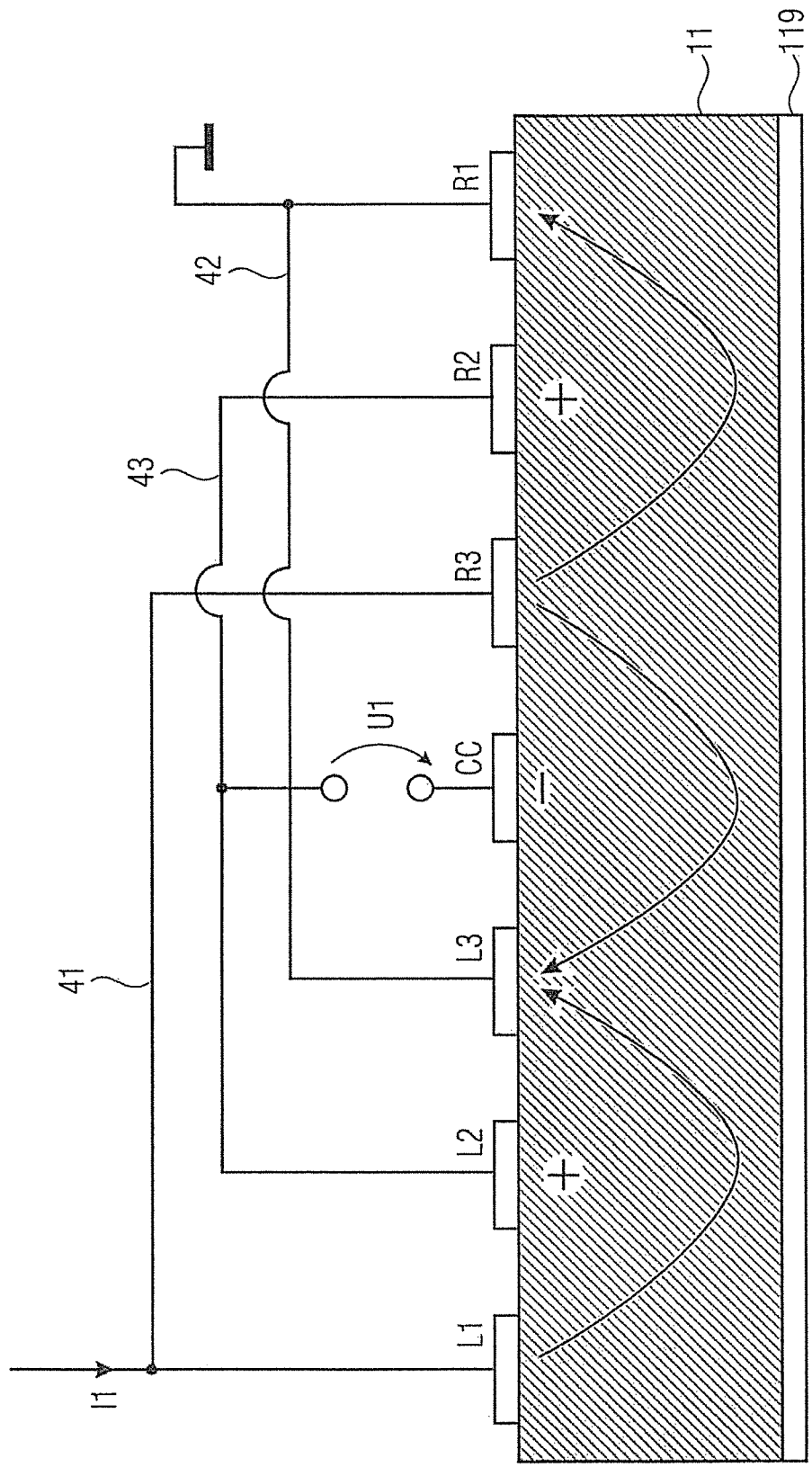
FIG. 9 shows a schematic cross-section of a vertical Hall device according to embodiments during a first clock phase of a spinning current scheme.

In the embodiment in FIG. 8 it can be noted that the current flowing from contact R3 to L3 is not yet used for a Hall signal. A further contact may be added right between the contacts L3 and R3. During the first clock phase of the spinning current scheme schematically illustrated in FIG. 8, the second portion of the supply current passes underneath such a center contact from right to left so that it responds with opposite sign ("minus sign") to applied magnetic fields than the contacts L2 and R2. A corresponding embodiment of the vertical Hall device is schematically illustrated in a cross-sectional view in FIG. 9. In the absence of magnetic fields (Bz=0), the electric potential of the center contact CC is at or very close to 0.5V (half of the supply voltage) due to the symmetry. Therefore, the sense signal U1 is zero (or very close to zero) at zero magnetic field. The vertical Hall device according to the embodiment in FIG. 9 has no, or only negligible, systematic raw offset in the first clock phase which is illustrated in FIG. 9. Due to small misalignments the device may exhibit some stochastic raw offset but this value is assumed to be much smaller than the 1.5 T stated above for the six-contact vertical Hall device of FIGS. 1 to 4.

Hence, at least some embodiments provide a seven-contact vertical Hall device where the first contact L1 is shorted to the fifth contact R3 (the third-to-the-last contact), wherein the second contact L2 is connected to the sixth contact R2 (second-to-the-last contact of the sequence of at least six contacts) and wherein the third contact L3 is connected to the seventh contact R1 (i.e., the last contact of the sequence of at least six contacts). The fourth contact CC is not connected or shorted to any other contact.

The supply current to the vertical Hall device during the first clock phase is designated by I1 in FIG. 9.

Figure 10:
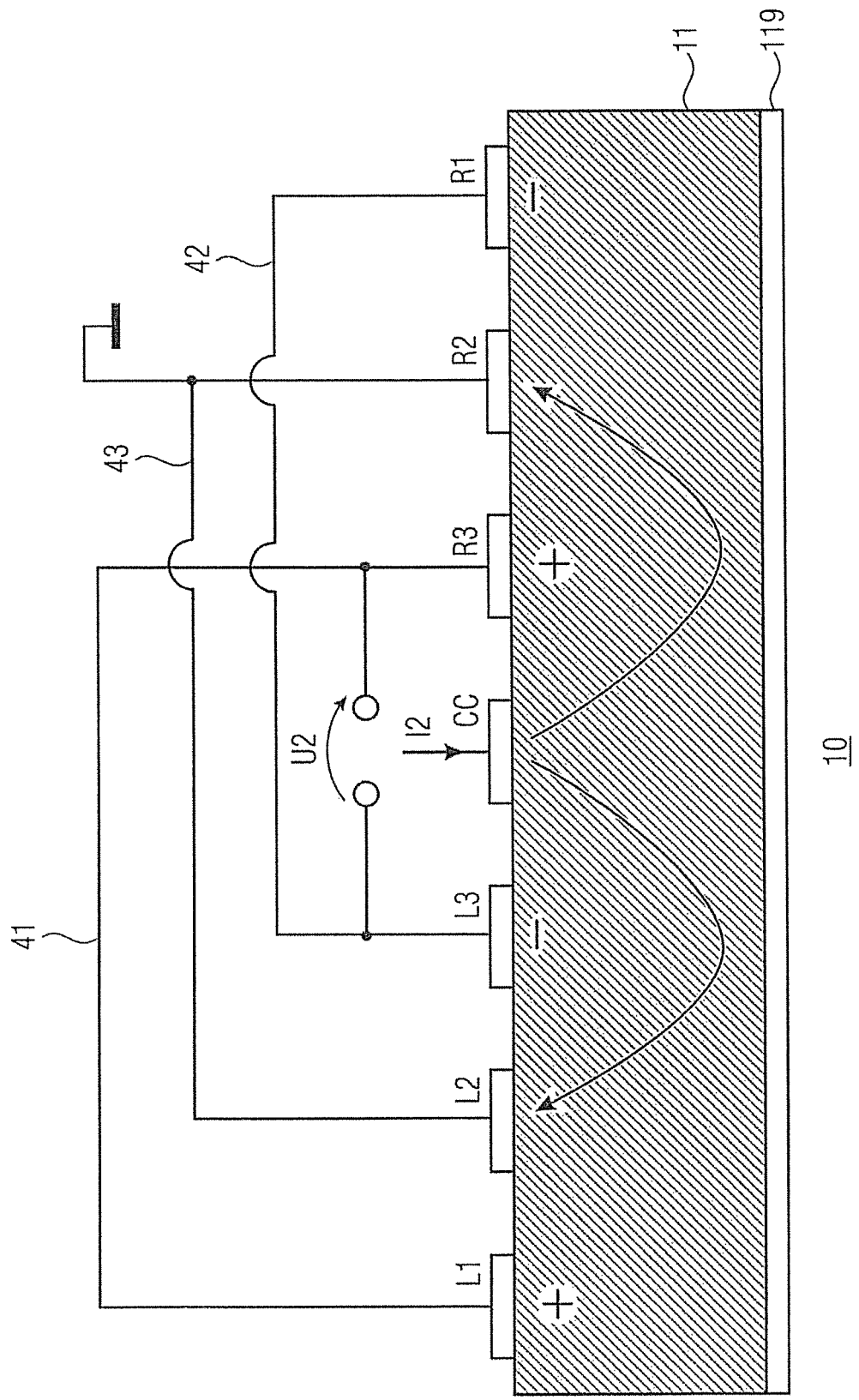
FIG. 10 shows a schematic cross-section of a vertical Hall device from FIG. 9 during a second clock phase of the spinning current scheme.

FIG. 10 shows a schematic cross-section of the vertical Hall device from FIG. 9 during the second clock phase of the spinning current scheme. A supply current I2 is supplied to the center contact CC. The second contact L2 and the second-to-the-last contact R2 function as low supply potential contacts during the second clock phase and are connected or tied to ground potential. Therefore, the supply current I2 splits up to approximately equal portions. A first portion flows from the center contact CC to the second contact L2 which is represented in FIG. 10 by an imaginary arc-shaped trajectory. The second portion of the supply current I2 flows from the center contact CC to the second-to-the-last contact R2 which is also represented in a schematic manner by an imaginary arc-shaped trajectory within the vertical Hall effect region 11. A first further sense signal can be measured at the third contact L3 and a further second sense signal can be measured at the third-to-the-last contact R3. The sense signal U2 for the second clock phase is the difference of the first and second further sense signals. The sense signal for the second clock phase U2 decreases with rising magnetic fields. Thus, the total output signal may be determined by subtracting U2 from U1, i.e., U1−U2. This doubles the magnetic field excursion and cancels or at least significantly reduces the offset.

Figure 11:
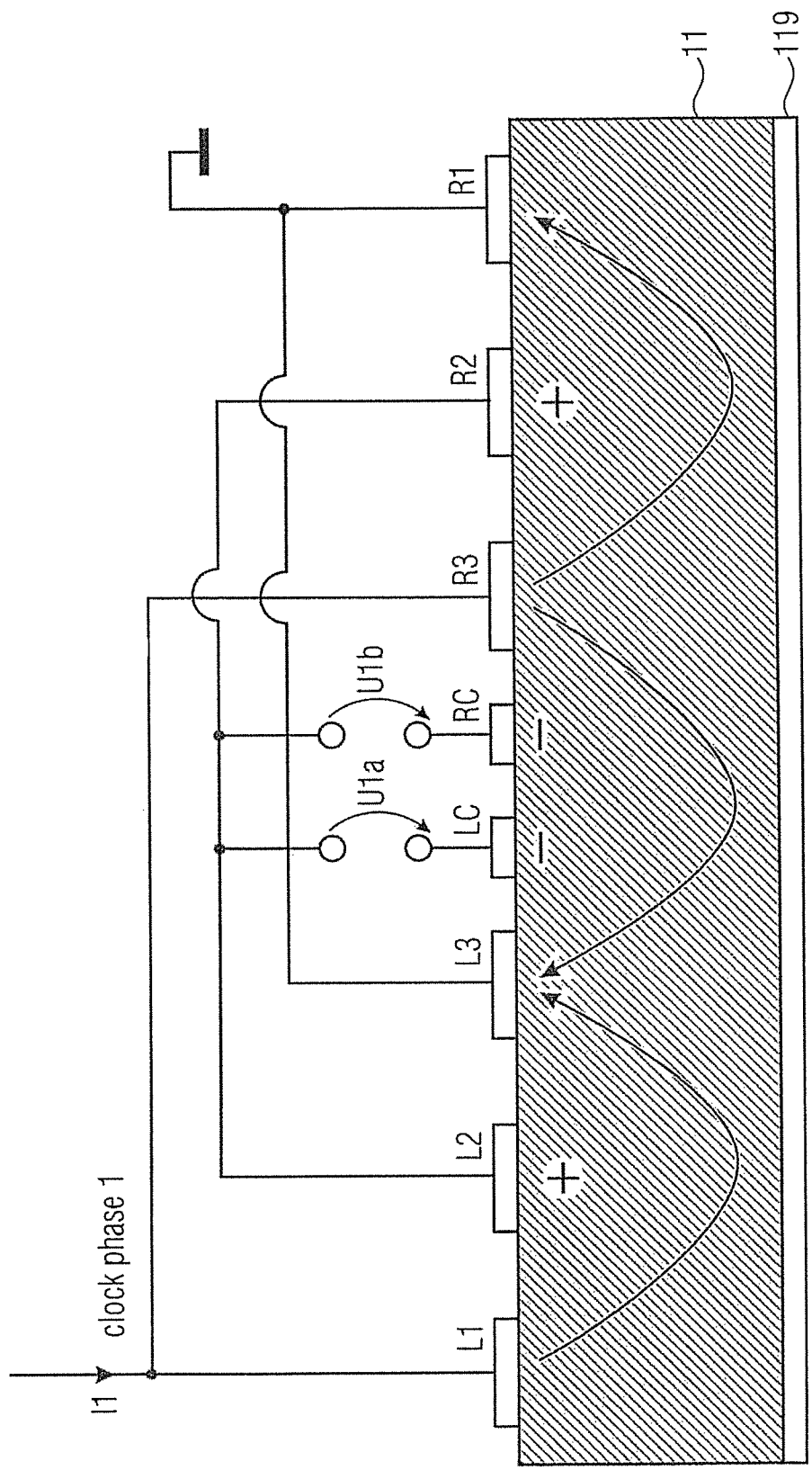
FIG. 11 shows a schematic cross-section of a vertical Hall device according to further embodiments during a first clock phase of a spinning current scheme.
Figure 12:
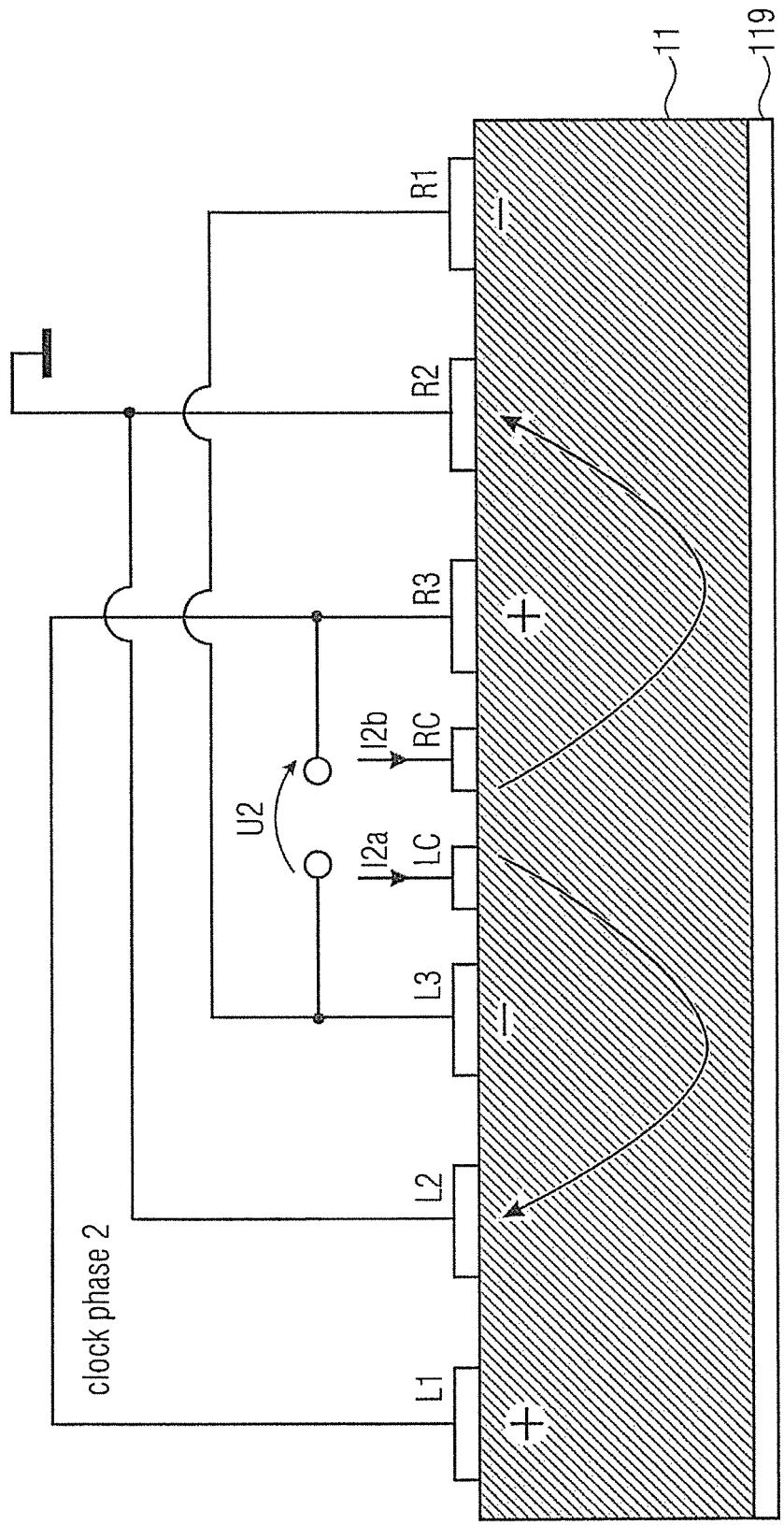
FIG. 12 shows a schematic cross-section of a vertical Hall device from FIG. 11 during a second clock phase of the spinning current scheme.

FIG. 11 shows a cross-section of a vertical Hall device according to further embodiments of the first clock phase of the spinning current scheme. According to these embodiments, the center contact CC in FIGS. 9 and 10 is split up into several contacts, for example two contacts LC and RC. FIG. 12 shows a schematic cross-section of the same vertical Hall device during the second clock phase.

The total signal or output signal is U1a+U1b−k*U2 where k is a number that depends on the ratio of I1/(I2a+I2b). If this ratio is equal to 1, the factor k is close to 1 (its exact value can be determined empirically so the residual offset in the total signal is as small as possible).

The vertical Hall device may further comprise a current adjusting element configured to adjust a supply current fed to or extracted from the center contact CC (or LC and RC) when the center contact is configured to function as a supply contact in accordance with the spinning current scheme, e.g., during the second clock phase as indicated in FIGS. 10 and 12. The current adjusting element may be, for example, a bank of resistors and associated fuses. The fuses can be selectively opened, for example by means of a laser during a testing step subsequent to a semiconductor manufacturing process for manufacturing the vertical Hall device. Another option is to use a laser trimming process in which a laser is used to burn away small portions of resistors, raising their resistance value. It is possible to perform the burning operation concurrently with a test of the vertical Hall device using automatic test equipment, for example. A gauged magnetic field sensor can be used to make certain that the vertical Hall device is in zero magnetic field during the parameter test. The laser trimming process can then be formed until the desired ratio of the supply currents during the first and second clock phases I1 and I2 (or I2a+I2b) is achieved. In other words, the current adjusting element may be configured to be calibrated by a test procedure during which the vertical Hall device is exposed to a zero magnetic field or to a magnetic field of a known strength and/or direction.

In embodiments in which the sequence of at least six contacts comprises a pair of center contacts LC, RC, the vertical Hall device may further comprise a current adjusting element configured to adjust a first supply current I2a fed to or extracted from the first center contact LC individually from a second supply current I2b fed to or extracted from the second center contact RC of the pair of center contacts during clock phases of the spinning current scheme in which the pair of center contacts is configured to function as supply contacts in accordance with the spinning current scheme. This current adjusting element which has an influence on the first center contact LC only, may also be calibrated during a test procedure in which the vertical Hall device is exposed to a zero magnetic field or to a magnetic field having defined known properties (strength and/or direction). During the test procedure, the values of the supply currents I1, I2, I2a and I2b may be measured and compared with each other. In the alternative or in addition, the values of the sense signals U1, U2, U1a and U1b may be measured and compared with each other. The measured values may then be used to calculate an optimal or near-optimal setting of the current adjusting element. A trimming equipment such as a laser trimming equipment may then be programmed to perform the calibration of the current adjusting element to obtain a calibrated vertical Hall device with small or even very small offset error. Nevertheless, it is to be noted that even without a current adjusting element and a calibration thereof, the vertical Hall devices, according to embodiments, can typically achieve very good performances with respect to the residual offset.

Figure 13:
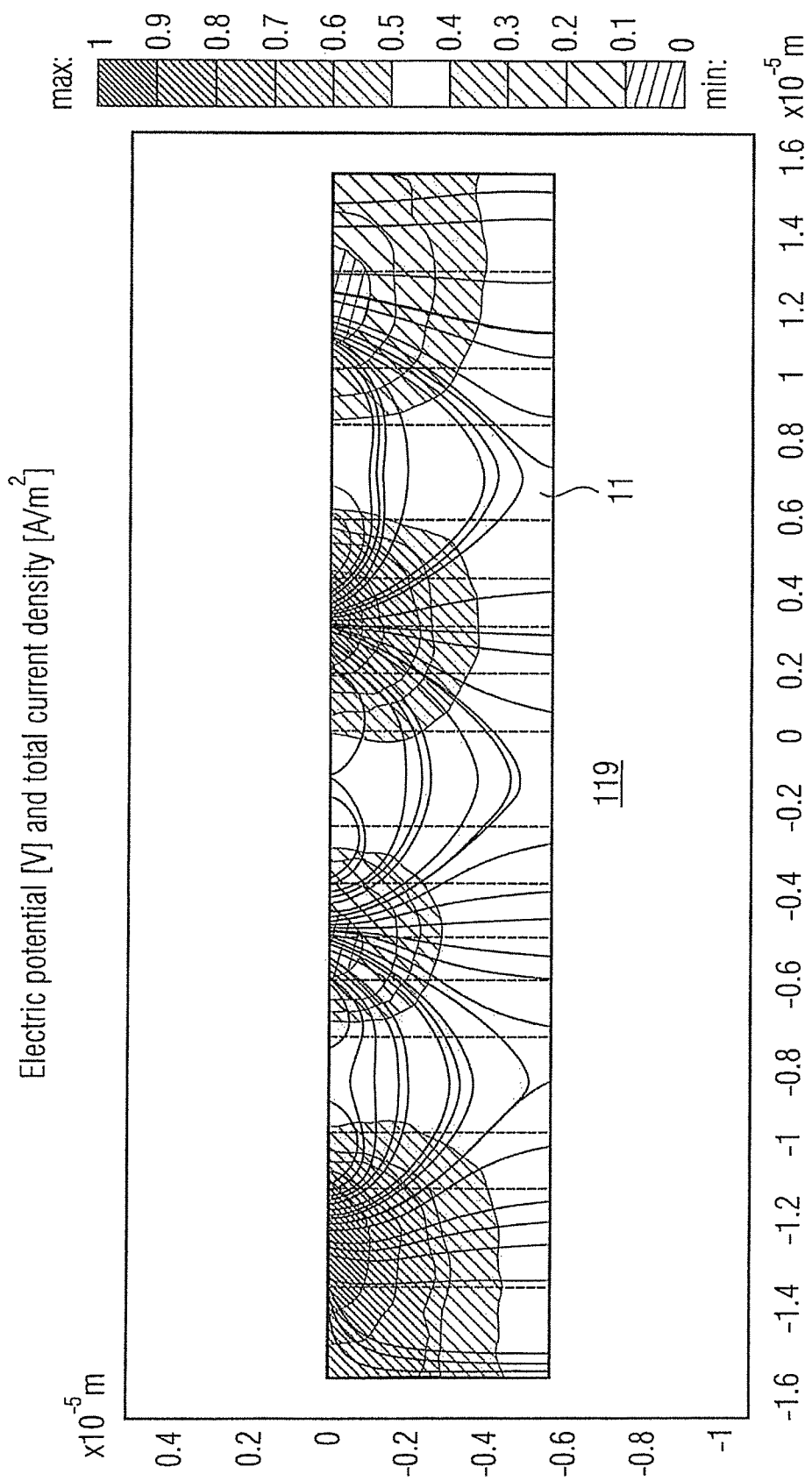
FIG. 13 illustrates the results of a numerical simulation of a vertical Hall device according to embodiments during a first clock phase of a spinning current scheme, namely an electric potential and a total current density within the Hall effect region of the vertical Hall device.

FIG. 13 shows a cross-section of the vertical Hall effect region 11 of a vertical Hall device according to the embodiment shown in FIGS. 9 and 10 in which the results of a numerical simulation regarding the electric potential and the total current density within the vertical Hall effect region are shown. The following parameters were used for the numerical simulation: all contacts 2.5 µm long, spacing between contacts 1.5 µm, width of device=3 µm, depth of device=5.5 µm. A n-doped buried layer 119 is adjacent to a surface of the vertical Hall effect region 11 that is opposite to the surface where the contacts L1 to R1 (from left to right) are arranged. The spacing of the outmost contacts L1 and R1 from the left and right edges is 2.5 µm, respectively.

The vertical Hall device is illustrated in the first clock phase in FIG. 13. Accordingly, a high supply potential is applied to the contacts L1 and R3. A low supply potential is applied to the contacts L3 and R1. The contact L2 and R2 function as (a) first sense contact(s) and the center contact CC functions as a second sense contact. The supply voltage of 1V leads to a total current of 266.4 µA which is supplied to the vertical Hall effect region 11 via the contacts L1 and R3. The resulting input resistance is 3754Ω. A zero magnetic field (Bz=0) was assumed for the numerical simulation of which the results are graphically illustrated in FIG. 13.

Figure 14:
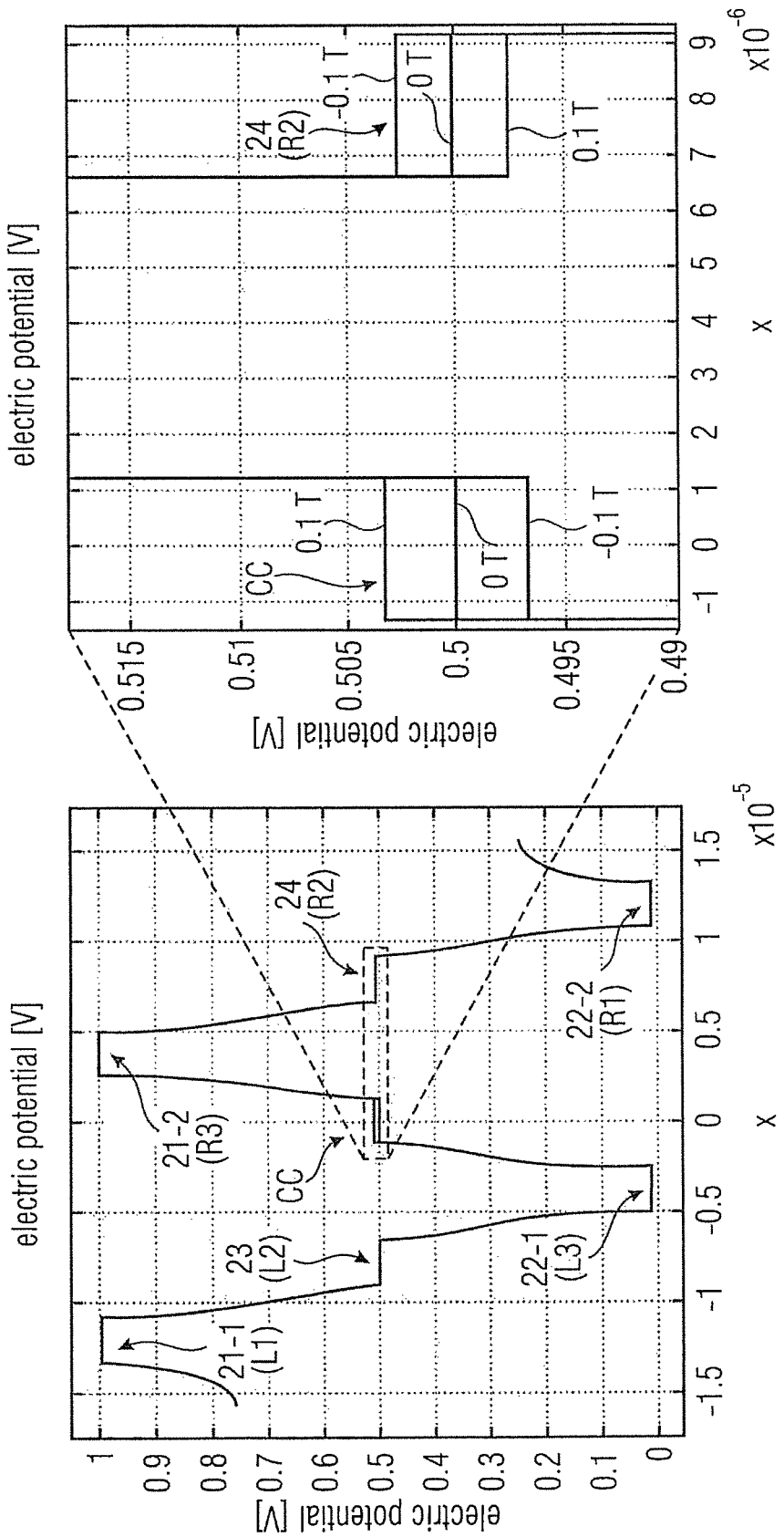
FIG. 14 graphically illustrates an electrical potential distribution along the surface of the vertical Hall device from FIG. 13 during the first clock phase of the spinning current scheme.

FIG. 14 graphically illustrates an electric potential distribution along the surface of the vertical Hall effect region 11 of a vertical Hall device according to embodiments of FIGS. 9 and 10 during the first clock phase of the spinning current scheme. The left portion of FIG. 14 show the overall electric potential distribution and the right portion of FIG. 14 shows a detailed view thereof for the center contact CC and the second-to-the-last contact 24 or R2. The electrical potential distribution is illustrated for three different values of the magnetic field, namely −0.1 T, 0 T and 0.1 T. In the overall view at the left of FIG. 14, the electric potential distribution for the three different cases appear to be substantially identical so that only a single line is drawn. In the detailed view on the right side of FIG. 14, the differences of the electric potential distributions for the three different magnetic field strengths can be seen. FIG. 14 shows that the interconnected contacts L2, R2 and the center contact CC are exactly at 0.5V. Accordingly, the systematic row offset vanishes.

For the zero magnetic field case (0 mT) applied to the vertical Hall sensor, the following potential can be determined. For the pair of interconnected contacts L2 and R2, the electric potential is 0.500007V. For the center contact CC the electric potential is 0.499995V. In other words, the electric potentials at the pair of interconnected contacts L2 and R2 and at the center contact CC are substantially equal and both at 0.5V.

At 100 mT=0.1 T applied magnetic field, the following electric potentials can be observed: 0.497411V at the pair of interconnected contacts L2 and R2, and 0.503343V at the center contact CC. Thus, electric potential at the pair of interconnected contacts L2, R2 goes down by −2.6 mV. The electric potential at the center contact CC goes up by 3.35 mV. The resulting voltage-related sensitivity of the vertical Hall device is Su=5.95 mV/V/100 mT=0.0595/T.

Figure 15:
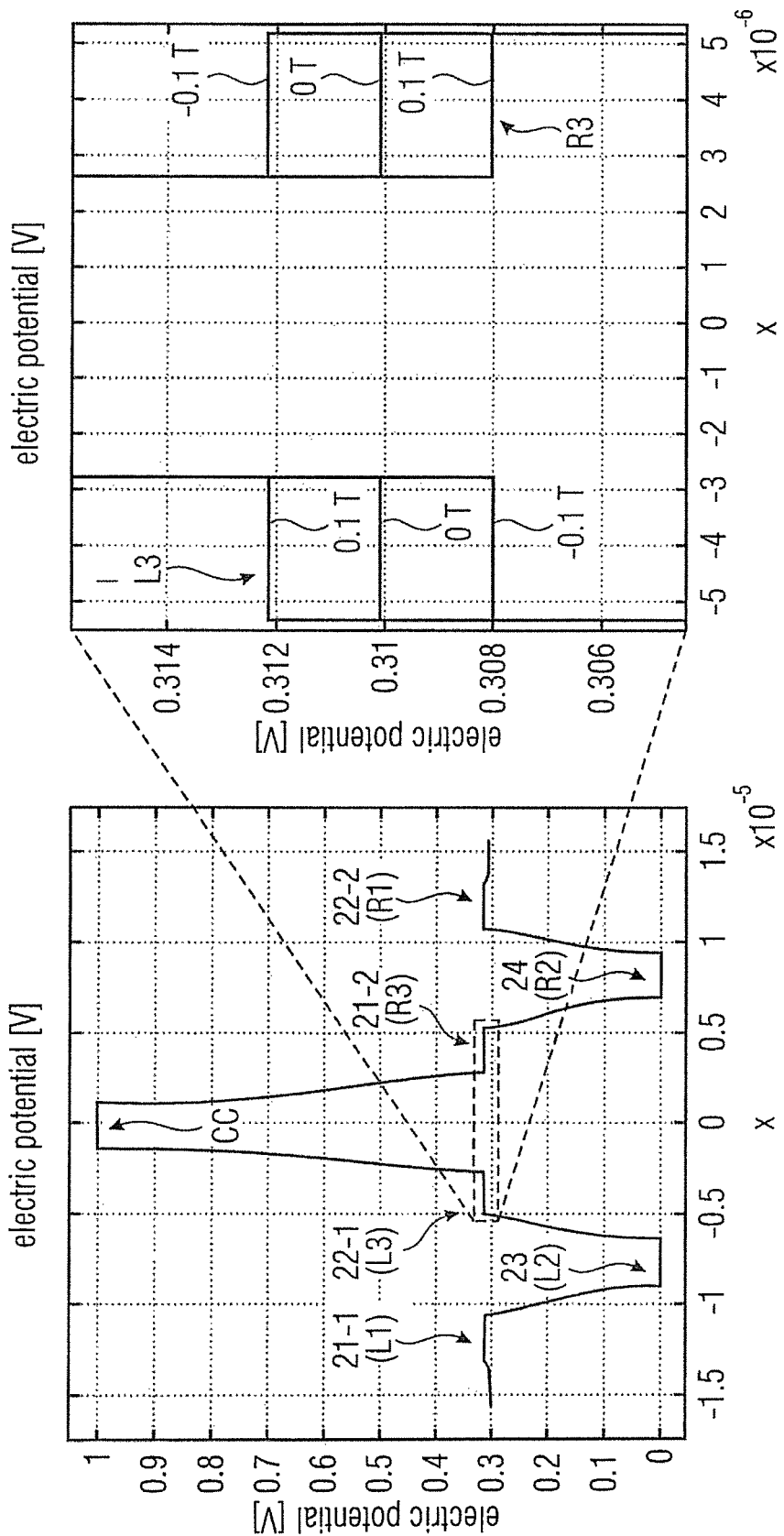
FIG. 15 graphically illustrates an electrical potential distribution along the surface of the vertical Hall device from FIG. 13 during a second clock phase of the spinning current scheme.

FIG. 15 graphically illustrates an electric potential distribution at a surface of the vertical Hall effect region 11 of the vertical Hall device from FIGS. 9 and 10 during the second clock phase (FIG. 10) of the spinning current scheme. As in FIG. 14, the left portion of FIG. 15 shows the overall electric potential distribution and the right portion of FIG. 15 shows a detailed view of the electric potential distribution at the contacts L3 or 22-1 and R3 or 21-2. At zero magnetic field (Bz=0 T) the contacts L3 and R3 are both at an electric potential of approximately 0.31V. For a magnetic field of −0.1 T the electric potential at contact L3 decreases to 0.308V and electric potential at the contact R3 increases to 0.3122V. For a magnetic field of +0.1T the electric potential at the contact L3 increases to 0.3122V and the electric potential at the contact R3 decreases to 0.308V. The resulting voltage-related sensitivity of the vertical Hall device for the second clock phase is Su=0.041/T.

By averaging the voltage-related sensitivities for the first and second clock phases, an average voltage-related magnetic sensitivity can be determined to be $Su_{avg}=0.05V/V/T$, which is quite good.

According to embodiments, a vertical Hall device uses several contacts arranged along a line on a surface of a Hall region 11. Some of the contacts are shorted: the leftmost contact L1 or 21-1 is shorted with the third contact R3 or 21-2 from the right side. The rightmost contact R1 or 22-2 is shorted with the third contact L3 or 22-1 from the left side. The second contact L2 or 23 from the left side may be shorted with the second contact R2 or 24 from the right side. The vertical Hall device may also comprise at least one center contact CC.

The vertical Hall device may be used in a spinning current scheme in that during a first clock phase the nodes containing the leftmost and rightmost contacts L1 (21-1) and R1 (22-2) serve as supply terminals and the other two nodes L2 (23) and R2 (24) serve as sense contacts. During a second clock phase of the spinning current scheme the roles of supply and sense terminals are swapped.

Finally, the output signals obtained during the different clock phases of the spinning current scheme may be subtracted to cancel the offset of the vertical Hall device.

According to some embodiments, the vertical Hall device may comprise a third contact interconnection 43 connecting the second contact 23 or L2 with the second-to-last-contact 24 or R2. In other words, the third contact interconnection 43 connects the second contact 23 of the first group of at least three contacts with a second contact 24 of the second group of at least three contacts. The third contact interconnection 43 thus corresponds to a contact interconnection connecting the first intermediate contact 23 with the second intermediate contact 24.

The first contact interconnection 41 and the second contact interconnection 42 may be hardwired. For example, the first and second contacts interconnections 41, 42 may be implemented as micro strip lines that are formed during the semiconductor manufacturing process by depositing one or more metallization layers and structuring the deposited metallization layers. In embodiments in which the vertical Hall device comprises a third contact interconnection 43, the third contact interconnection 43 may also be hardwired. When the contacts of the vertical Hall device are defined as a first pair of interconnected contacts 21-1, 21-2 and a second pair of interconnected contacts 22-1, 22-2, the corresponding connections between the interconnected contacts may also be hardwired. Hardwired contact interconnections may provide a higher similarity and thus electrical symmetry than contact interconnections comprising further electronic components, such as solid state switches (e.g., field effect transistors).

According to further embodiments at least a subset of the contacts of the sequence of contacts may be configured to function alternately as supply contacts and sense contacts in accordance with a spinning current scheme. According to other embodiments contacts that do not function as spinning current contacts, i.e., alternately as supply contacts and sense contacts in accordance with the spinning current scheme, typically do not count as contacts of the sequence of at least six contacts. Therefore, at least some embodiments may provide auxiliary contacts, dummy contacts and/or floating contacts etc. between the contacts of the sequence of at least six contacts but these are typically not counted within the sequence of at least six contacts.

When dividing the contacts in a first group of at least three contacts and a second group of at least three contacts (and possibly a center contact), the first group may comprise a first subset of contacts that are configured to function alternately as supply contacts and sense contacts in accordance with the spinning current scheme. The second group of at least three contacts may comprise a second subset of contacts that may also be configured to function alternately as supply contacts and sense contacts in accordance with the spinning current scheme.

In some embodiments, the sequence of at least six contacts may extend along a line. In alternative embodiments, the sequence of at least six contacts may extend along an angled, curved, arc-shaped, etc., trajectory. In an analog manner, the first group of contacts may extend along a line and also the second group of contacts may extend along the same line or another line. The other line along which the contacts of the second group extend may be at an angle or be parallel offset to the line of the first group of contacts. The first group of contacts may also extend on a curved or zig-zag projectory. The same may also be true for the second group of contacts.

According to some embodiments, the vertical Hall device may further comprise a subtractor configured to subtract a first sense signal U1 from a second sense signal U2. The first sense signal U1 may be provided at the second contact L2, the second-to-the-last contact R2 and possibly the center contact CC. In particular, the first sense signal may be a difference of the electric potentials between the pair L2, R2 and the center contact CC, i.e., a voltage. Thus, the first sense signal U1 is at least partially provided at the second contact L2 and the second-to-the-last contact R2 in the first clock phase. The second sense signal may be provided at the first contact L1, the third-to-the-last contact R3, the third contact L3 and the last contact R1 during the second clock phase. In particular, the second sense signal U2 may be a difference between the electric potentials of the contact pair L1, R3 and L3, R1.

Figure 16:
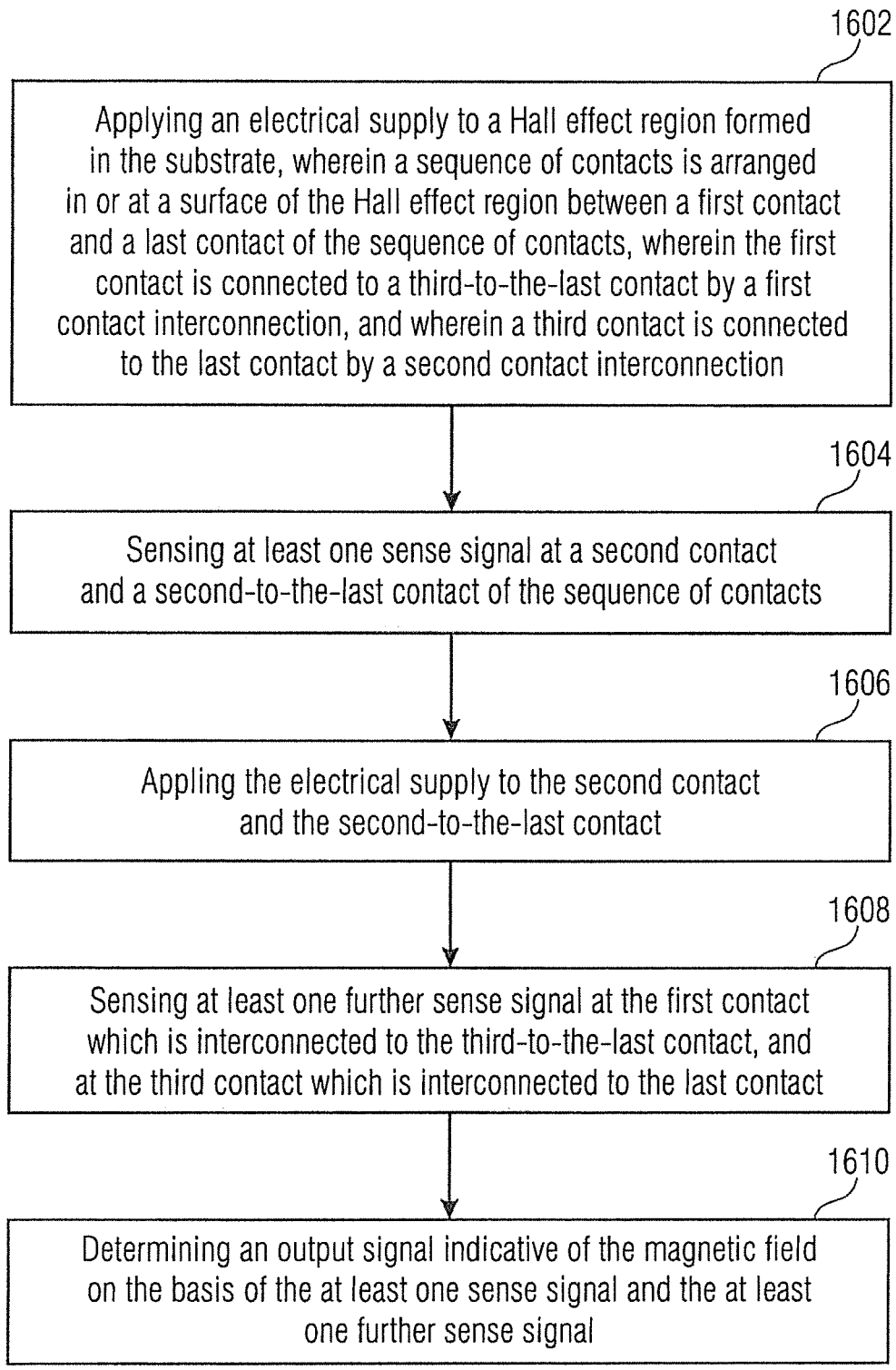
FIG. 16 shows a schematic flow diagram of a sensing method for sensing a magnetic field according to embodiments.

FIG. 16 shows a schematic flow diagram of a sensing method for sensing a magnetic field parallel to a surface of a substrate, typically a semiconductor substrate. The method comprises a step 1602 of applying an electrical supply to a Hall effect region formed in the substrate. A sequence of at least six contacts is arranged in or at a surface of the Hall effect region between a first contact and a last contact of the sequence of contacts. The first contact is connected to a third-to-the-last contact by a first contact interconnection. A third contact is connected to the last contact by a second contact interconnection. Typically, the sequence of contacts may be arranged in a symmetrical manner in or at the surface of the Hall effect region.

At a step 1604 of the sensing method, at least one sense signal is sensed at a second contact and a second to the last contact of the sequence of contacts.

The electrical supply or another electrical supply is then applied to the second contact and the second to the last contact, as indicated at a step 1606 of the schematic flow diagram in FIG. 16. At the same time the electrical supply is typically disconnected from the first contact, the third contact, the-third-to-the-last contact and the last contact which have functioned as supply contacts during the steps 1602 and 1604. The step 1606 may be regarded as a transition from a first clock phase to a second clock phase of a spinning current scheme.

While the electrical supply is applied to the second contact and the second-to-the-last contact, at least one further sense signal is sensed at the first contact which is interconnected to the third-to-the-last contact and/or at the third contact which is interconnected to the last contact, as indicated at step 1608 in FIG. 16.

The sensing method also comprises a step 1610 of determining an output signal indicative of the magnetic field (more precisely: the component of the magnetic field that is parallel to the surface of the substrate and orthogonal to an extension of the sequence of contacts). The determination of the output signal is performed on the basis of the at least one sense signal and the at least one further sense signal which have been obtained during the first and second clock phases of the spinning current scheme.

In case the vertical Hall device comprises a center contact or a pair of center contacts which is/are arranged in or at the surface of the Hall effect region, the method may further comprise a step of sensing at least one center sense signal concurrently with the step of sensing the at least one sense signal at the second contact and the second-to-the-last contact. Furthermore, the electrical supply may also be supplied to the center contact or the pair of center contacts concurrently with the step 1606 of applying the electrical supply to the second contact and the second-to-the-last contact.

According to embodiments the sensing method may further comprise a step of adjusting an electrical current that is fed to or extracted from the center contact or the pair of center contacts in the context of applying the electrical supply to the center contact or the pair of center contacts. The adjusting may be based on a previously conducted calibration (typically immediately following a manufacturing process of the vertical Hall device or as a final stage of the manufacturing process), wherein the calibration has been performed under known conditions regarding the magnetic field (e.g., in a zero magnetic field) so that an offset error of the vertical Hall device is reduced by a suitable adjustment of the electrical current fed to or extracted from the center contact or the pair of center contacts.

Figure 17:
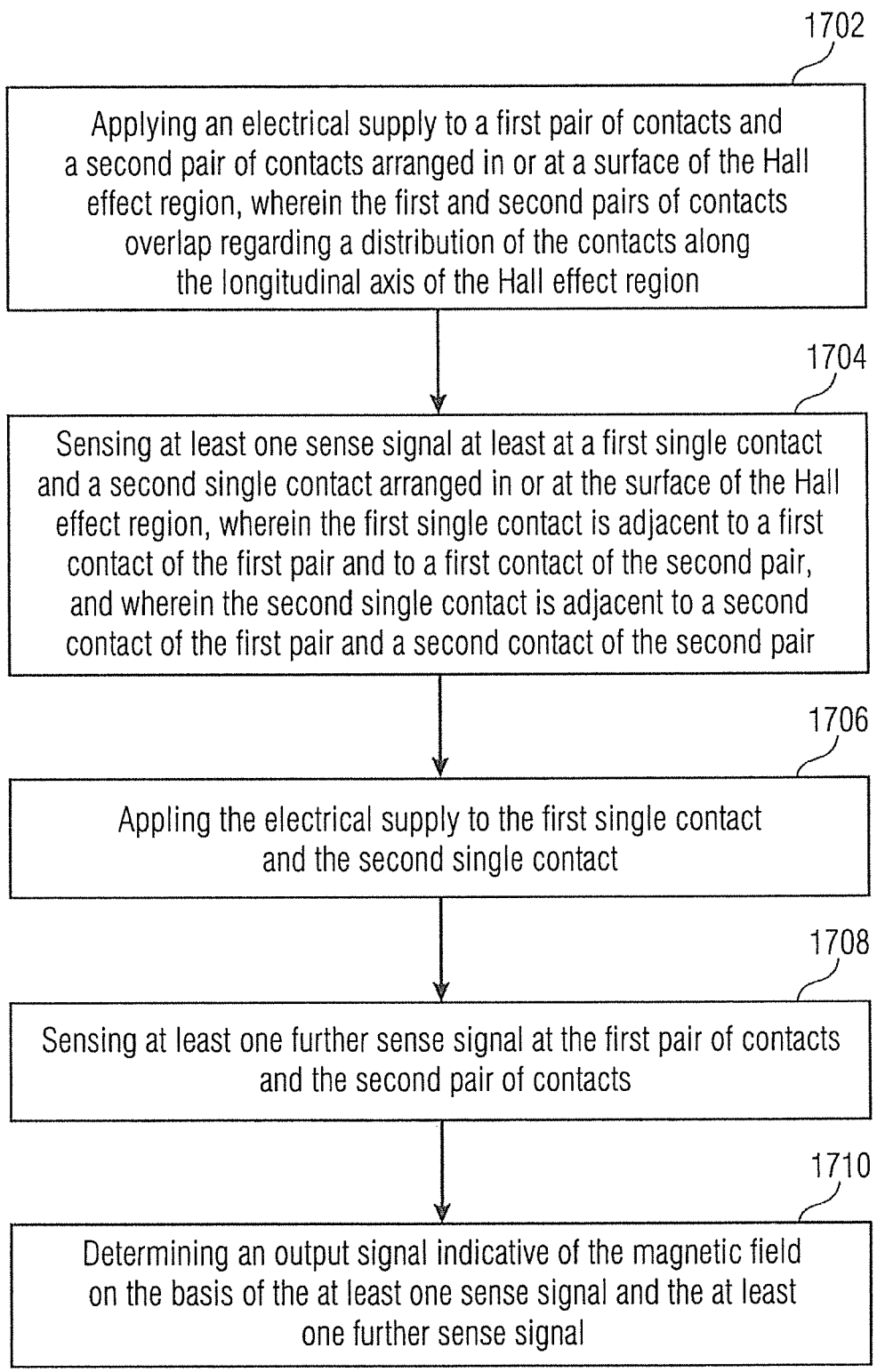
FIG. 17 shows a schematic flow diagram of a sensing method for sensing a magnetic field according to further embodiments.

FIG. 17 shows a schematic flow diagram of a sensing method according to alternative embodiments. Again, the sensing method may be used to sense a magnetic field parallel to a surface of a substrate in which a (vertical) Hall effect region is formed. The Hall effect region has a longitudinal axis. The sensing method comprises a step 1702 of applying an electrical supply to a first pair of contacts and a second pair of contacts arranged in or at a surface of the Hall effect region. First and second pairs of contacts overlap regarding a distribution of the contacts along the longitudinal axis of the Hall effect region.

The sensing method further comprises a step 1704 of sensing at least one sense signal at least at a first intermediate contact and a second intermediate contact with the first and second intermediate contacts are also arranged in or at the surface of the Hall effect region. The first intermediate contact is adjacent to both a first contact of the first pair and a first contact of the second pair. The second intermediate contact is adjacent to both a second contact of the first pair and a second contact of the second pair.

At a step 1706 the electric supply or another electric supply is applied to the first intermediate contact and the second intermediate contact. Typically, the electric supply applied to the first pair of contacts and the second pair of contacts at step 1702 is discontinued at this point. The steps 1702 and 1704 may be regarded as a first clock phase of a spinning current scheme and the steps 1706 and 1708 may be regarded as corresponding to a second clock phase of the spinning current scheme. In particular, at least one further sense signal is sensed during step 1708 at the first pair of contacts and the second pair of contacts. Thus, the first and second pairs of contacts now function as sense contacts during the second clock phase.

The sense signal obtained at step 1704 and the further sense signal obtained at step 1708 are then used at a step 1710 of determining an output signal indicative of the magnetic field (in particular, the component of the magnetic field that is parallel to a surface of the substrate and substantially orthogonal to an extension of the plurality of contacts) based on the at least one sense signal and the at least one further sense signal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A vertical Hall device comprising:
a Hall effect region formed in a substrate;
a sequence of at least six contacts arranged in or at a surface of the Hall effect region between and including a first contact and a last contact;
a first contact interconnection connecting the first contact with a third-to-the-last contact; and
a second contact interconnection connecting a third contact with the last contact,
wherein the first contact, the third-to-the-last-contact, the third contact, and the last contact are configured to function as supply contacts during a first clock phase of a spinning current scheme and as sense contacts during a second clock phase of the spinning current scheme; and
wherein a second contact and a next-to-the-last contact are configured to function as sense contacts during the first clock phase and as supply contacts during the second clock phase.

2. The vertical Hall device according to claim 1, further comprising a third contact interconnection connecting a second contact with a second-to-the-last contact.

3. The vertical Hall device according to claim 1, wherein the first contact interconnection and the second contact interconnection are hardwired.

4. The vertical Hall device according to claim 1, wherein at least a subset of the contacts of the sequence of contacts is configured to function alternatingly as supply contacts and sense contacts in accordance with a spinning current scheme.

5. The vertical Hall device according to claim 1, wherein the sequence of at least six contacts extends along a line.

6. The vertical Hall device according to claim 1, wherein the sequence of at least six contacts comprises a center contact.

7. The vertical Hall device according to claim 6, wherein the center contact is not connected to any other contact of the sequence of contacts via a contact interconnection.

8. The vertical Hall device according to claim 6, further comprising a current adjusting element configured to adjust a supply current fed to or extracted from the center contact when the center contact is configured to function as a supply contact in accordance with a spinning current scheme.

9. The vertical Hall device according to claim 8, wherein the current adjusting element is configured to be calibrated by a test procedure during which the vertical Hall device is exposed to a zero magnetic field.

10. The vertical Hall device according to claim 1, wherein the sequence of at least six contacts comprises a pair of center contacts.

11. The vertical Hall device according to claim 10, further comprising a current adjusting element configured to adjust a first supply current fed to or extracted from the first center contact individually from a second supply current fed to or extracted from a second center contact of the pair of center contacts during clock phases of a spinning current scheme in which the pair of center contacts is configured to function as supply contacts in accordance with the spinning current scheme.

12. The vertical Hall device according to claim 1, further comprising a subtractor configured to subtract a first sense signal from a second sense signal,
wherein the first sense signal is provided at the second contact and the next-to-the-last contact during the first clock phase, and
wherein the second sense signal is provided at the first contact, the third-to-the-last contact, the third contact, and the last contact during the second clock phase.

13. A vertical Hall device comprising:
a Hall effect region formed in a substrate, the Hall effect region being symmetric with respect to at least one symmetry axis that is parallel to a surface of the substrate;
a first group of at least three contacts arranged in or at the surface of the Hall effect region at a first side of the at least one symmetry axis, the first group of contacts being ordered in a descending order regarding their respective distances relative to the symmetry axis;
a second group of at least three contacts arranged in or at a surface of the Hall effect region at a second side of the at least one symmetry axis, the second group of contacts being symmetrical to the first group of contacts relative to the at least one symmetry axis and ordered in a descending order regarding their respective distances relative to the symmetry axis;
a first contact interconnection connecting a first contact of the first group of contacts with a third contact of the second group of contacts; and
a second contact interconnection connecting a third contact of the first group of contacts with a first contact of the second group of contacts, wherein the first and third contacts of the first group and the first and third contacts of the second group are configured to function as supply contacts during a first clock phase of a spinning current scheme and as sense contacts during a second clock phase of the spinning current scheme; and wherein a second contact of the first group and a second contact of the second group are configured to function as sense contacts during the first clock phase and as supply contacts during the second clock phase.

14. The vertical Hall device according to claim 13, further comprising a third contact interconnection connecting a second contact of the first group of contacts with a second contact of the second group of contacts.

15. The vertical Hall device according to claim 13, wherein at least a first subset of the first group of contacts and a second subset of the second group of contacts are configured to function alternatingly as supply contacts and sense contacts in accordance with a spinning current scheme.

16. The vertical Hall device according to claim 13, wherein the contacts of the first group of contacts and the contacts of the second group of contacts are aligned along a line.

17. The vertical Hall device according to claim 13, further comprising a center contact or a pair of center contacts arranged between the first group of contacts and the second group of contacts.

18. A vertical Hall device comprising:
a Hall effect region formed in a substrate and having a longitudinal axis;
a first pair of interconnected contacts arranged in or at a surface of the Hall effect region and configured to function as supply contacts during a first clock phase of a spinning current scheme and as sense contacts during a second clock phase of the spinning current scheme;
a second pair of interconnected contacts arranged in or at the surface of the Hall effect region and configured to function as supply contacts during the first clock phase of the spinning current scheme and as sense contacts during the second clock phase of the spinning current scheme, wherein the first and second pairs of contacts overlap regarding a distribution of the contacts along the longitudinal axis of the Hall effect region;
a first intermediate contact arranged in or at the surface of the Hall effect region adjacent to a first contact of the first pair and to a first contact of the second pair, the first intermediate contact being configured to function as a sense contact during the first clock phase; and
a second intermediate contact arranged in or at the surface of the Hall effect region adjacent to a second contact of the first pair and a second contact of the second pair, the second intermediate contact being configured to function as a sense contact during the first clock phase.

19. The vertical Hall device according to claim 18, further comprising a contact interconnection connecting the first intermediate contact with the second intermediate contact.

20. The vertical Hall device according to claim 18, wherein the first pair of contacts, the second pair of contacts, the first intermediate contact, and the second intermediate contact are aligned along a line.

21. The vertical all device according to claim 18, further comprising a center contact or a pair of center contacts arranged between a first contact of the second pair of contacts and a second contact of the first pair of contacts.

22. A sensing method for sensing a magnetic field parallel to a surface of a substrate, the method comprising:
applying an electrical supply to a Hall effect region formed in the substrate, wherein a sequence of contacts is arranged in or at a surface of the Hall effect region between and including a first contact and a last contact of the sequence of contacts, wherein the first contact is connected to a third-to-the-last contact by a first contact interconnection, and wherein a third contact is connected to the last contact by a second contact interconnection;
sensing at least one sense signal at a second contact and a second-to-the-last contact of the sequence of contacts;
applying the electrical supply to the second contact and the second-to-the-last contact;
sensing at least one further sense signal at the first contact which is interconnected to the third-to-the-last contact, and at the third contact which is interconnected to the last contact; and
determining an output signal indicative of the magnetic field based on the at least one sense signal and the at least one further sense signal,
wherein the first contact, the third-to-the-last-contact, the third contact, and the last contact are configured to function as supply contacts during a first clock phase of a spinning current scheme and as sense contacts during a second clock phase of the spinning current scheme; and
wherein the second contact and the second-to-the-last contact are configured to function as sense contacts during the first clock phase and as supply contacts during the second clock phase.

23. The sensing method according to claim 22, wherein a center contact or a pair of center contacts is arranged in or at the surface of the Hall effect region, the method further comprising:
sensing at least one center sense signal concurrently with the step of sensing the at least one sense signal at the second contact and the second-to-the-last contact; and
applying the electrical supply also to the center contact or the pair of center contacts concurrently with the step of applying the electrical supply to the second contact and the second-to-the-last contact.

24. The sensing method according to claim 23, further comprising:
adjusting an electrical current that is fed to or extracted from the center contact or the pair of center contacts in the context of applying the electrical supply to the center contact or the pair of center contacts, wherein the adjusting is performed under known conditions regarding the magnetic field so that an offset error of the vertical Hall device is reduced by a suitable adjustment.

25. A sensing method for sensing a magnetic field parallel to a surface of a substrate in which a Hall effect region is formed, the Hall effect region having a longitudinal axis, the method comprising:
applying an electrical supply to a first pair of contacts and a second pair of contacts arranged in or at a surface of the Hall effect region, wherein the first and second pairs of contacts overlap regarding a distribution of the contacts along the longitudinal axis of the Hall effect region;
sensing at least one sense signal at least at a first intermediate contact and a second intermediate contact arranged in or at the surface of the Hall effect region, wherein the first intermediate contact is adjacent to a first contact of the first pair and to a first contact of the second pair, and wherein the second intermediate contact is adjacent to a second contact of the first pair and a second contact of the second pair;
applying the electrical supply to the first intermediate contact and the second intermediate contact;

sensing at least one further sense signal at the first pair of contacts and the second pair of contacts; and determining an output signal indicative of the magnetic field based on the at least one sense signal and the at least one further sense signal, wherein the first pair of contacts and the second pair of contacts are configured to function as supply contacts during a first clock phase of a spinning current scheme and as sense contacts during a second clock phase of the spinning current scheme; and wherein the first intermediate contact and the second intermediate contact are configured to function as sense contacts during the first clock phase and as supply contacts during the second clock phase.

* * * * *